(12) United States Patent
Cheng et al.

(10) Patent No.: US 12,051,746 B2
(45) Date of Patent: Jul. 30, 2024

(54) SEMICONDUCTOR DEVICE STRUCTURE WITH DIELECTRIC LAYER

(71) Applicant: Taiwan Semiconductor Manufacturing Company, Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 17/884,388

(22) Filed: Aug. 9, 2022

(65) Prior Publication Data

US 2022/0384635 A1    Dec. 1, 2022

Related U.S. Application Data

(60) Continuation of application No. 17/120,870, filed on Dec. 14, 2020, now Pat. No. 11,476,361, which is a
(Continued)

(51) Int. Cl.
*H01L 29/78* (2006.01)
*H01L 21/02* (2006.01)
(Continued)

(52) U.S. Cl.
CPC .... *H01L 29/7813* (2013.01); *H01L 21/02172* (2013.01); *H01L 21/022* (2013.01);
(Continued)

(58) Field of Classification Search
CPC .............. H01L 29/7813; H01L 29/785; H01L 21/02172; H01L 21/022; H01L 21/02304;
(Continued)

(56) References Cited

U.S. PATENT DOCUMENTS 8,643,113 B2    2/2014  Chambers et al.
8,772,109 B2    7/2014  Colinge
(Continued)

FOREIGN PATENT DOCUMENTS

CN    102386217 A  *  3/2012
CN    103578946 A  *  2/2014   ....... H01L 21/28079
(Continued)

*Primary Examiner* — Matthew E Warren
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a gate stack over the substrate. The gate stack includes a first dielectric layer, a work function layer, and a gate electrode sequentially stacked over the substrate, the first dielectric layer has a thin portion and a thick portion, the thin portion is thinner than the thick portion and surrounds the thick portion, and the first dielectric layer is a single-layer structure. The semiconductor device structure includes an insulating layer over the substrate and wrapping around the gate stack. The thin portion is between the thick portion and the insulating layer.

20 Claims, 27 Drawing Sheets

Related U.S. Application Data division of application No. 16/285,595, filed on Feb. 26, 2019, now Pat. No. 10,868,171.

(51) Int. Cl.
*H01L 21/033* (2006.01)
*H01L 21/762* (2006.01)
*H01L 21/8234* (2006.01)

(52) U.S. Cl.
CPC .... *H01L 21/02323* (2013.01); *H01L 21/0234* (2013.01); *H01L 21/02381* (2013.01); *H01L 21/02532* (2013.01); *H01L 21/0337* (2013.01); *H01L 21/76224* (2013.01); *H01L 21/823431* (2013.01); *H01L 21/82345* (2013.01); *H01L 21/823462* (2013.01); *H01L 29/785* (2013.01)

(58) Field of Classification Search
CPC ........... H01L 21/02323; H01L 21/0234; H01L 21/0337; H01L 21/823431; H01L 21/82345; H01L 21/823462
See application file for complete search history.

(56) References Cited

U.S. PATENT DOCUMENTS

| | | |
|---|---|---|
| 8,772,148 B1 * | 7/2014 | Wang ................ H01L 29/66545 |
| | | 438/585 |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,991,365 B1 * | 6/2018 | Cheng ............... H01L 29/66666 |
| 2014/0070320 A1 | 3/2014 | Mukherjee et al. |
| 2015/0137269 A1 * | 5/2015 | Li ..................... H01L 29/66545 |
| | | 257/407 |
| 2017/0025536 A1 * | 1/2017 | Liang .................... H01L 29/785 |
| 2018/0166274 A1 | 6/2018 | Lin et al. |
| 2019/0035917 A1 * | 1/2019 | Cheng .................... H01L 29/401 |
| 2019/0237464 A1 | 8/2019 | Ching et al. |
| 2020/0098623 A1 | 3/2020 | Cheng et al. |

FOREIGN PATENT DOCUMENTS

| | | | | |
|---|---|---|---|---|
| KR | 10-2017-0093672 A | | 8/2017 | |
| KR | 20170093672 A | * | 8/2017 | ........... H01L 29/513 |

* cited by examiner

SEMICONDUCTOR DEVICE STRUCTURE WITH DIELECTRIC LAYER

CROSS REFERENCE

This application is a Continuation of U.S. application Ser. No. 17/120,870, filed on Dec. 14, 2020, which is a Divisional of U.S. application Ser. No. 16/285,595, filed on Feb. 26, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
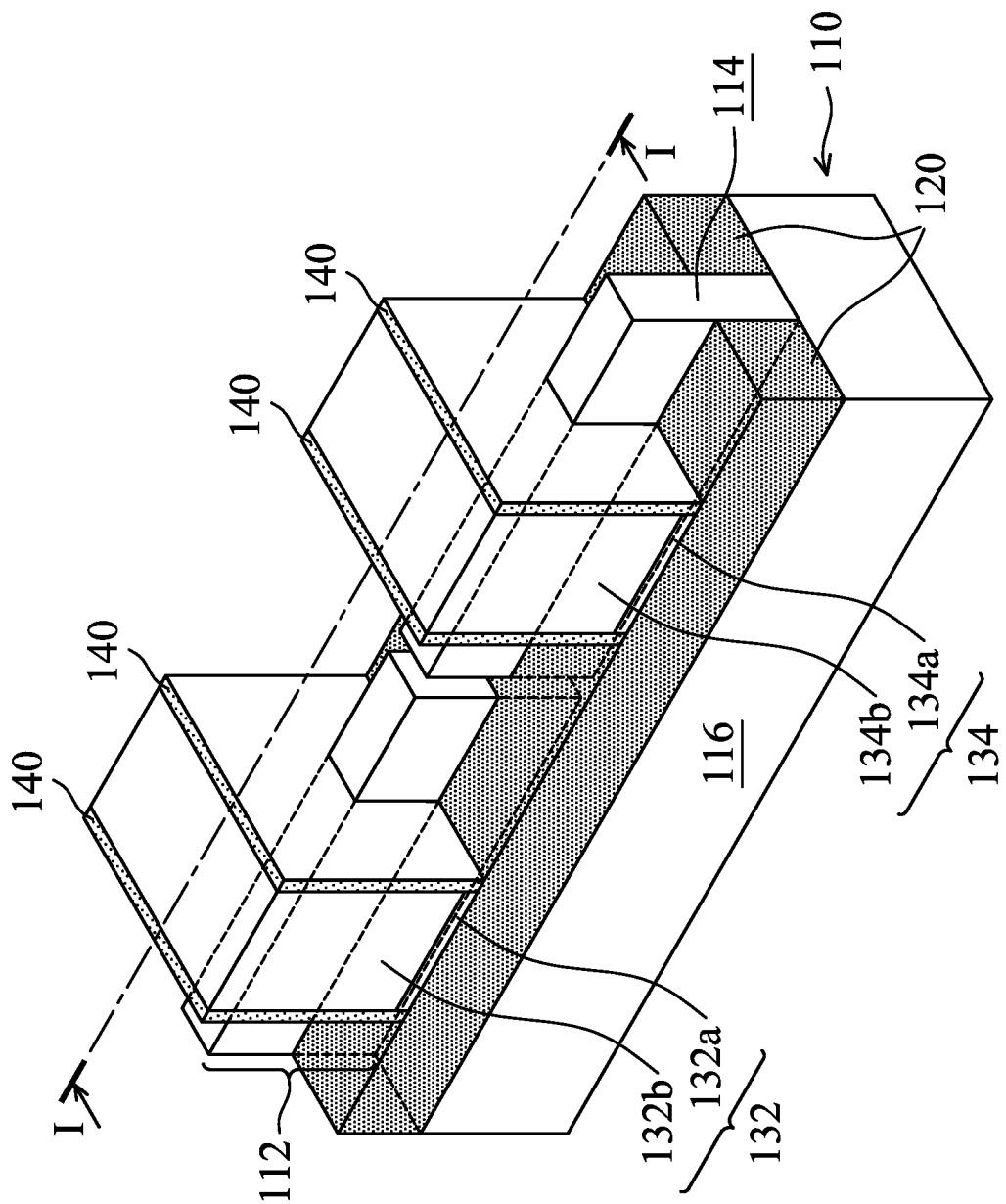
FIG. 1 is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
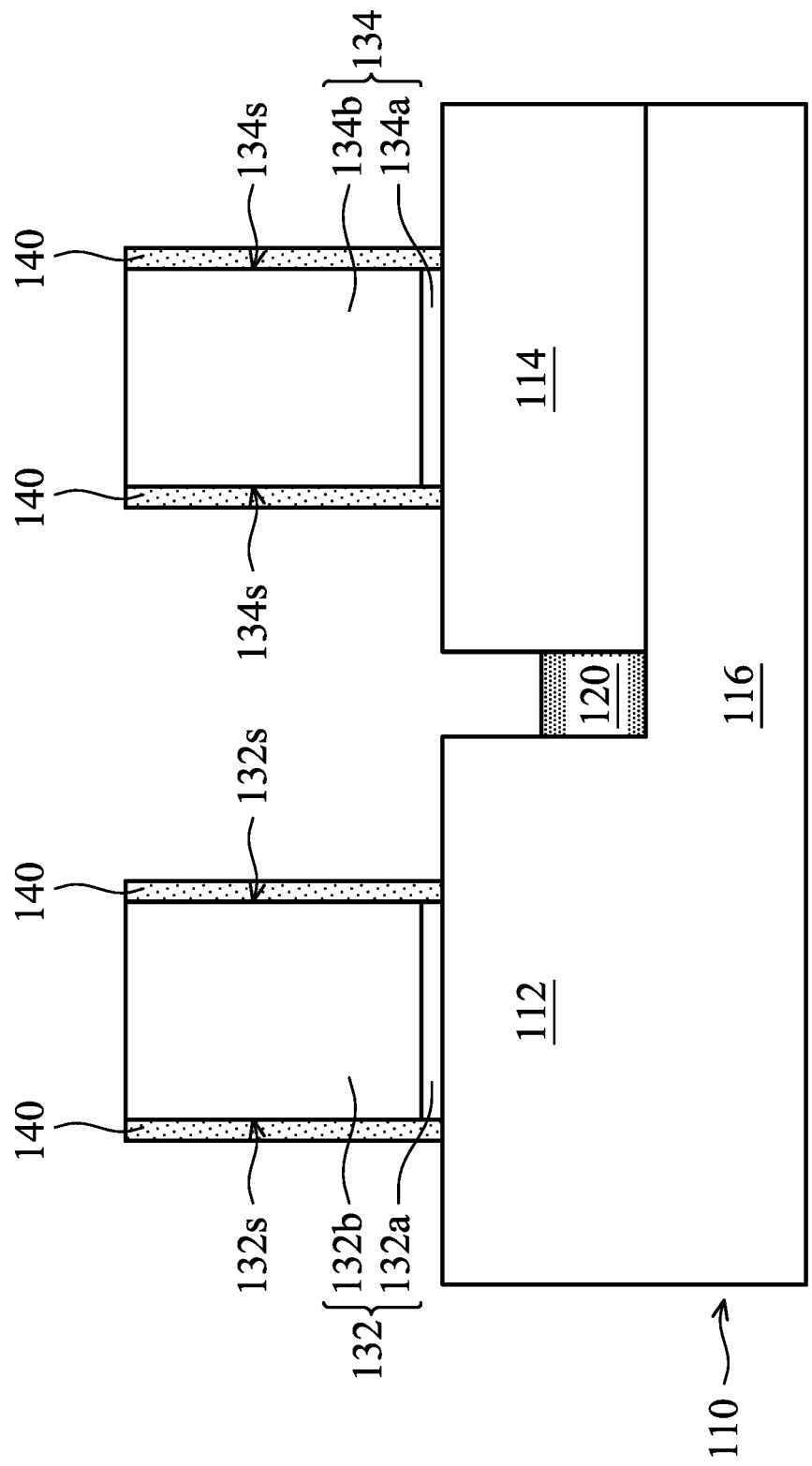
FIGS. 2A-2P are cross-sectional views of various stages of a process for forming a semiconductor device structure, in accordance with some embodiments.

FIG. 1 is a perspective view of a semiconductor device structure, in accordance with some embodiments. FIG. 2A is a cross-sectional view illustrating the semiconductor device structure along a sectional line I-I in FIG. 1, in accordance with some embodiments. FIGS. 2A-2P are cross-sectional views of various stages of a process for forming a semiconductor device structure, in accordance with some embodiments.

As shown in FIGS. 1 and 2A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, as shown in FIGS. 1 and 2A, the substrate 110 has fin structures 112 and 114 and a base 116, in accordance with some embodiments. The fin structures 112 and 114 are over the base 116, in accordance with some embodiments. The fin structures 112 and 114 are spaced apart from each other, in accordance with some embodiments.

In some embodiments, the fin structure 112 and the base 116 are made of the same semiconductor material, which is different from a semiconductor material of the fin structure 114. In some embodiments, the fin structure 112 and the base 116 are made of silicon, and the fin structure 114 is made of silicon germanium.

As shown in FIGS. 1 and 2A, an isolation layer 120 is formed over the base 116, in accordance with some embodiments. Each of the fin structure 112 or 114 is partially in the isolation layer 120, in accordance with some embodiments. The isolation layer 120 surrounds lower portions of the fin structures 112 and 114, in accordance with some embodiments.

The isolation layer 120 includes an insulating material, such as an oxide-containing material (e.g., silicon dioxide), in accordance with some embodiments. The isolation layer 120 is formed by a chemical vapor deposition (CVD) process and an etching back process, in accordance with some embodiments.

As shown in FIGS. 1 and 2A, gate stacks 132 and 134 are respectively formed over the fin structures 112 and 114, in accordance with some embodiments. The gate stack 132 extends across the fin structure 112, in accordance with some embodiments. The gate stack 132 wraps around an upper portion of the fin structure 112, in accordance with some embodiments. The gate stack 134 extends across the fin structure 114, in accordance with some embodiments. The gate stack 134 wraps around an upper portion of the fin structure 114, in accordance with some embodiments.

The gate stack 132 includes a gate dielectric layer 132a and a gate electrode 132b, in accordance with some embodiments. The gate electrode 132b is formed over the gate dielectric layer 132a, in accordance with some embodiments. The gate stack 134 includes a gate dielectric layer 134a and a gate electrode 134b, in accordance with some embodiments. The gate electrode 134b is formed over the gate dielectric layer 134a, in accordance with some embodiments.

The gate dielectric layers 132a and 134a are made of an insulating material, such as an oxide-containing material (e.g., silicon dioxide), in accordance with some embodiments. The gate electrodes 132b and 134b are made of a semiconductor material (e.g., polysilicon) or a conductive material, in accordance with some embodiments.

As shown in FIGS. 1 and 2A, spacers 140 are formed over sidewalls 132s and 134s of the gate stacks 132 and 134, in accordance with some embodiments. The spacers 140 respectively surround the gate stacks 132 and 134, in accordance with some embodiments. The spacers 140 are made of an insulating material, such as a silicon-containing material (e.g., silicon dioxide, silicon nitride, silicon oxynitride, silicon carbide, or the like), in accordance with some embodiments. The formation of the spacers 140 includes a deposition process and an anisotropic etching process, in accordance with some embodiments.

Figure 2B:
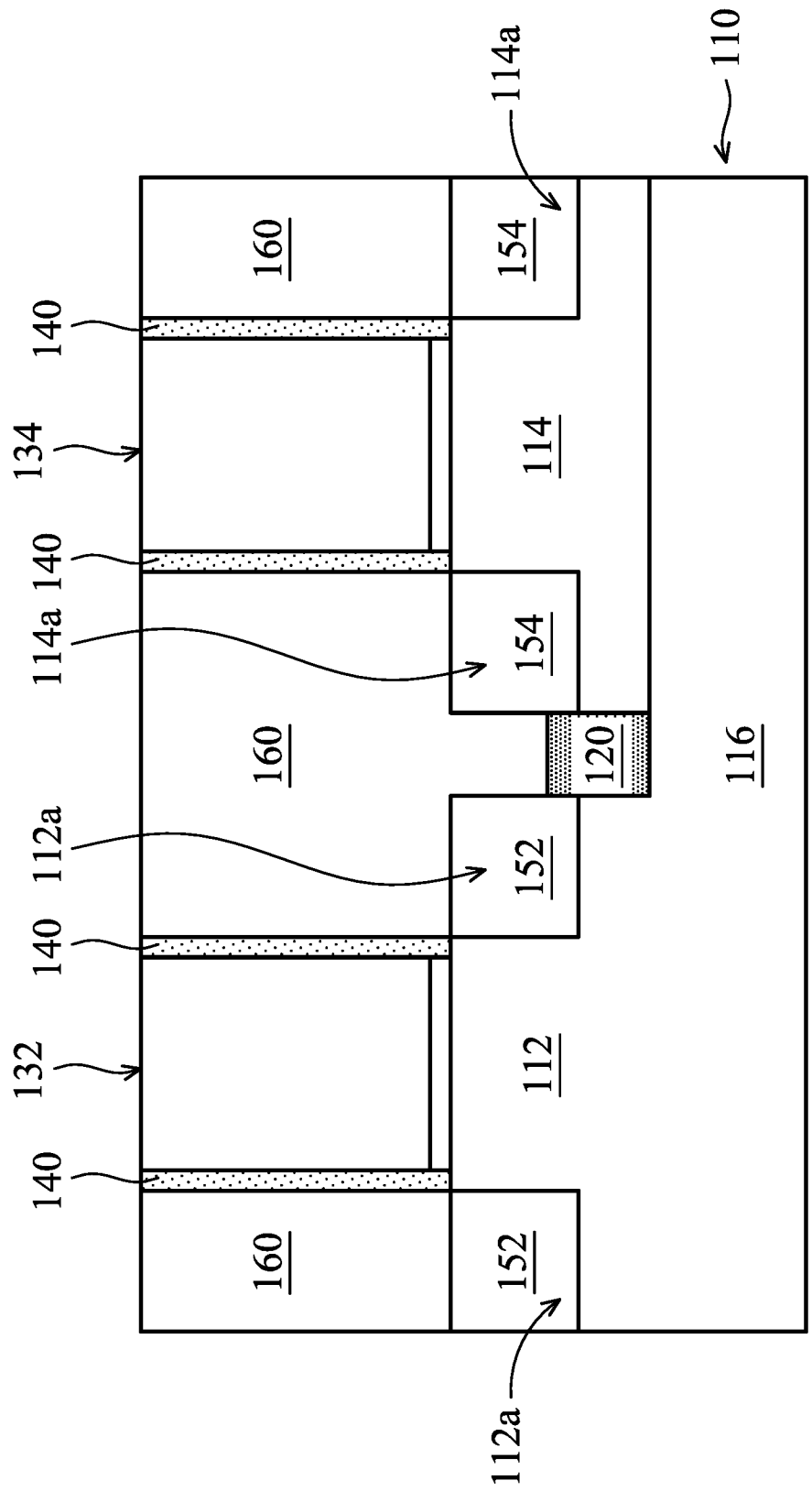

As shown in FIG. 2B, portions of the fin structures 112 and 114 are removed to respectively form recesses 112a and 114a in the fin structures 112 and 114, in accordance with some embodiments. As shown in FIG. 2B, stressors 152 and 154 are respectively formed in the recesses 112a and 114a, in accordance with some embodiments. The stressors 152 and 154 are respectively in direct contact with the fin structures 112 and 114, in accordance with some embodiments.

One and the other of the stressors 152 are also referred to as a source structure and a drain structure, in accordance with some embodiments. One and the other of the stressors 154 are also referred to as a source structure and a drain structure, in accordance with some embodiments.

The stressors 152 are made of a semiconductor material (e.g., silicon) with N-type dopants, such as the Group VA element, in accordance with some embodiments. The Group VA element includes phosphor (P), antimony (Sb), or another suitable Group VA material. The stressors 154 are made of a semiconductor material (e.g., silicon germanium) with P-type dopants, such as the Group IIIA element, in accordance with some embodiments. The Group IIIA element includes boron or another suitable material. The stressors 152 and 154 are formed using epitaxial processes, in accordance with some embodiments.

As shown in FIG. 2B, an insulating layer 160 is formed over the substrate 110, in accordance with some embodiments. The insulating layer 160 is made of an oxide-containing material, such as silicon dioxide, or another suitable insulating material, in accordance with some embodiments. The insulating layer 160 is formed by a deposition process (e.g., a chemical vapor deposition process) and a planarization process (e.g., a chemical mechanical polishing process), in accordance with some embodiments.

Figure 2C:
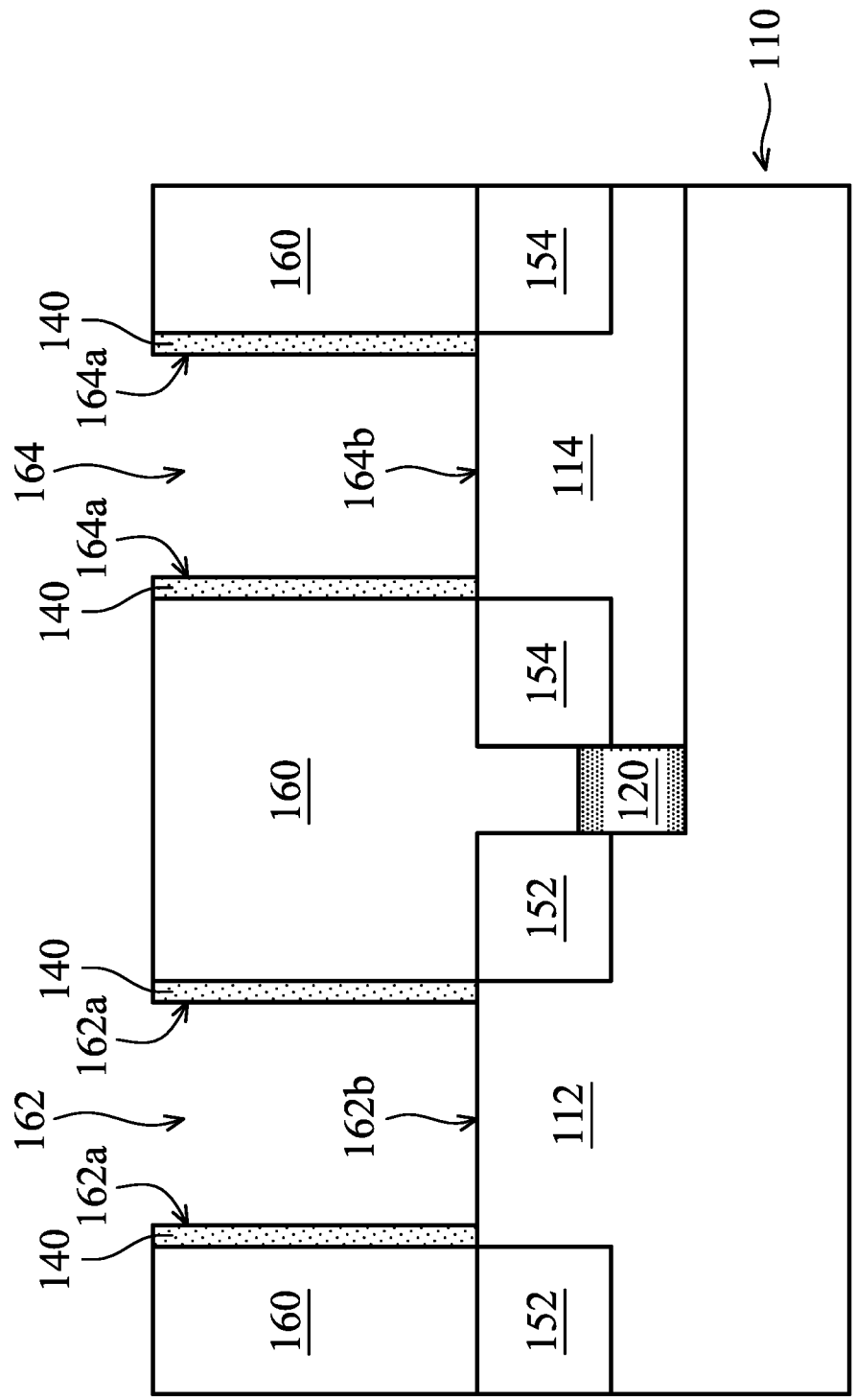

As shown in FIG. 2C, the gate stacks 132 and 134 are removed, in accordance with some embodiments. After the removal process, trenches 162 and 164 are formed between the spacers 140, in accordance with some embodiments. The trenches 162 and 164 are in the insulating layer 160, in accordance with some embodiments. The trench 162 partially exposes the fin structure 112, in accordance with some embodiments. The trench 162 extends across the fin structure 112, in accordance with some embodiments. The trench 162 has inner walls 162a and a bottom 162b, in accordance with some embodiments.

The trench 164 partially exposes the fin structure 114, in accordance with some embodiments. The trench 164 extends across the fin structure 114, in accordance with some embodiments. The trench 164 has inner walls 164a and a bottom 164b, in accordance with some embodiments. The removal process includes an etching process, in accordance with some embodiments.

Figure 2D:
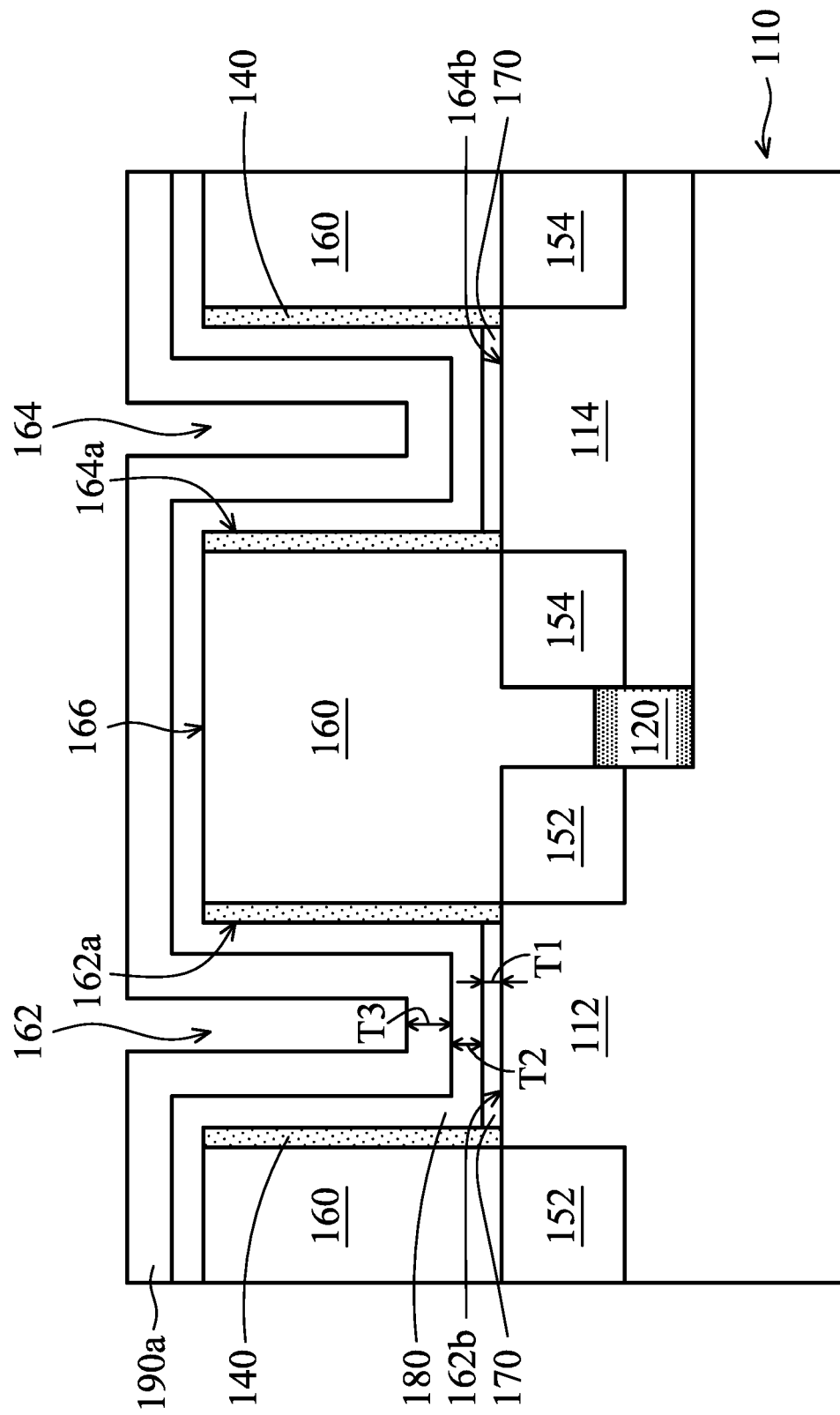

As shown in FIG. 2D, a dielectric layer 170 is formed over the fin structures 112 and 114 exposed by the trenches 162 and 164, in accordance with some embodiments. The dielectric layer 170 is configured to improve the adhesion between the fin structure 112 or 114 and a gate dielectric layer subsequently formed on the dielectric layer 170, in accordance with some embodiments. The dielectric layer 170 has a thickness T1 ranging from about 5 Å to about 15 Å, in accordance with some embodiments.

The dielectric layer 170 is made of an oxide-containing material, such as silicon dioxide, in accordance with some embodiments. The formation of the dielectric layer 170 includes performing an oxidization process over the fin structures 112 and 114 respectively exposed by the trenches 162 and 164, in accordance with some embodiments. The oxidization process includes a plasma treatment, a wet treatment, or a combination thereof, in accordance with some embodiments.

The plasma treatment includes a plasma using a gas of oxygen ($O_2$), ozone ($O_3$), the like, or a combination thereof. The wet treatment uses a standard clean-1 (SC1) solution and a standard clean-2 (SC2) solution, in accordance with some embodiments. The SC1 solution is a mixture of DI water, ammonium hydroxide ($NH_4OH$), and hydrogen peroxide ($H_2O_2$) at a mixture ratio of 5:1:1 of DI:$NH_4OH$:$H_2O_2$, in accordance with some embodiments. The SC2 solution is a mixture of deionized (DI) water, hydrochloric (HCl) acid, and hydrogen peroxide ($H_2O_2$) at a mixture ratio of 5:1:1 of DI:HCl:$H_2O_2$, in accordance with some embodiments.

As shown in FIG. 2D, a gate dielectric layer 180 is formed over the dielectric layer 170 and the inner walls 162a and 164a of the trenches 162 and 164, in accordance with some embodiments. The gate dielectric layer 180 is also formed over a top surface 166 of the insulating layer 160, in accordance with some embodiments. The gate dielectric layer 180 has a thickness T2 ranging from about 10 Å to about 20 Å, in accordance with some embodiments.

In some embodiments, a dielectric constant of the gate dielectric layer 180 is greater than a dielectric constant of the dielectric layer 170. The dielectric constant of the gate dielectric layer 180 is greater than a dielectric constant of silicon dioxide, in accordance with some embodiments. The gate dielectric layer 180 is also referred to as a high dielectric-constant (high-k) layer, in accordance with some embodiments.

The gate dielectric layer 180 is made of a high-k dielectric material, such as hafnium dioxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The formation of the gate dielectric layer 180 includes conformally depositing the gate dielectric layer 180 over the dielectric layer 170 and the spacers 140, in accordance with some embodiments. The deposition process includes a chemical vapor deposition process, an atomic layer deposition (ALD) process, or a physical vapor deposition process, in accordance with some embodiments. In some embodiments, the gate dielectric layer 180 is made of hafnium dioxide, and the gate dielectric layer 180 is formed using an atomic layer deposition process using $HfCl_4$ and $H_2O$ as a precursor.

As shown in FIG. 2D, a mask material layer 190a is formed over the gate dielectric layer 180, in accordance with some embodiments. The mask material layer 190a has a thickness T3 ranging from about 30 Å to about 50 Å, in accordance with some embodiments. The thickness T3 is greater than the thickness T2, in accordance with some embodiments. The thickness T3 is greater than the thickness T1, in accordance with some embodiments.

The mask material layer 190a is made of a nitrogen-containing material, such as a metal nitride material, in accordance with some embodiments. The metal nitride material includes titanium nitride (TiN), tantalum nitride (TaN), or another suitable metal nitride material.

The mask material layer 190a is formed using a chemical vapor deposition process, an atomic layer deposition (ALD) process, or a physical vapor deposition process, in accordance with some embodiments. In some embodiments, the mask material layer 190a is made of titanium nitride, and the mask material layer 190a is formed using an atomic layer deposition process using $TiCl_4$ and $NH_3$ as a precursor.

Figure 2E:
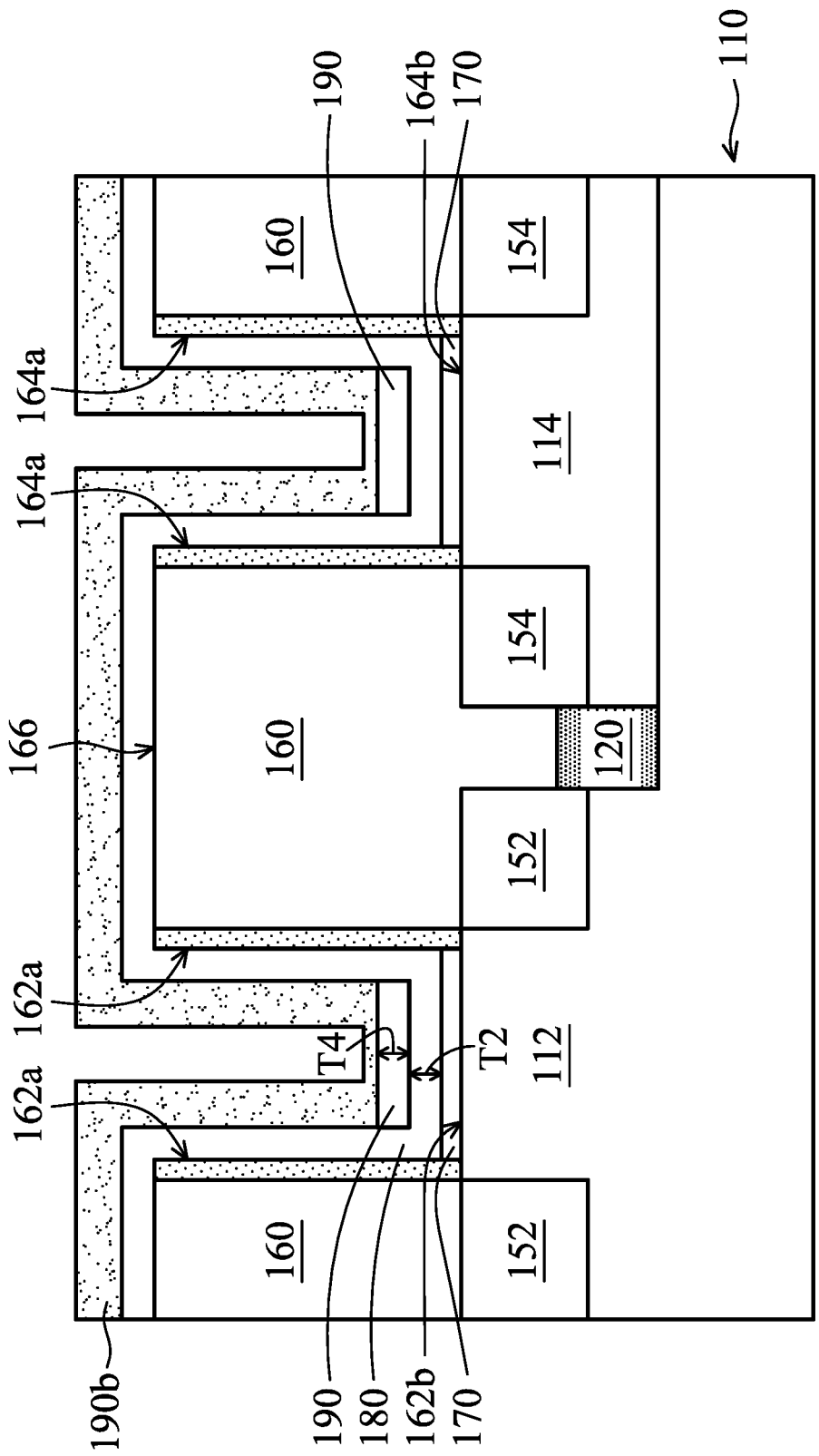

As shown in FIGS. 2D-2E, an oxidation process is performed over the mask material layer 190a to oxidize the mask material layer 190a over the inner walls 162a and 164a and the top surface 166, in accordance with some embodiments. In some embodiments, upper portions of the mask material layer 190a over the bottoms 162b and 164b of the trenches 162 and 164 are also oxidized by the oxidation process.

The mask material layer 190a over the inner walls 162a and 164a and the upper portions of the mask material layer 190a over the bottoms 162b and 164b are oxidized into an oxidized mask layer 190b, in accordance with some embodiments. The oxidized mask layer 190b includes metal oxide, such as titanium oxide or tantalum oxide, in accordance with some embodiments. In some embodiments, lower portions of the mask material layer 190a over the bottoms 162b and 164b is not oxidized by the oxidation process and forms mask layers 190.

The mask layer 190 (or the lower portion of the mask material layer 190a) is thicker than the gate dielectric layer 180 over the bottoms 162b and 164b, in accordance with some embodiments. That is, a thickness T4 of the mask layer 190 is greater than the thickness T2 of the gate dielectric layer 180 over the bottoms 162b and 164b, in accordance with some embodiments.

The oxidation process includes a plasma oxidation process, in accordance with some embodiments. There is no bias voltage applied during the plasma oxidation process, in accordance with some embodiments. Therefore, during the plasma oxidation process, a first oxidation rate of the mask material layer 190a over the inner walls 162a and 164a is greater than a second oxidation rate of the mask material layer 190a over the bottoms 162b and 164b, in accordance with some embodiments.

Figure 2F:
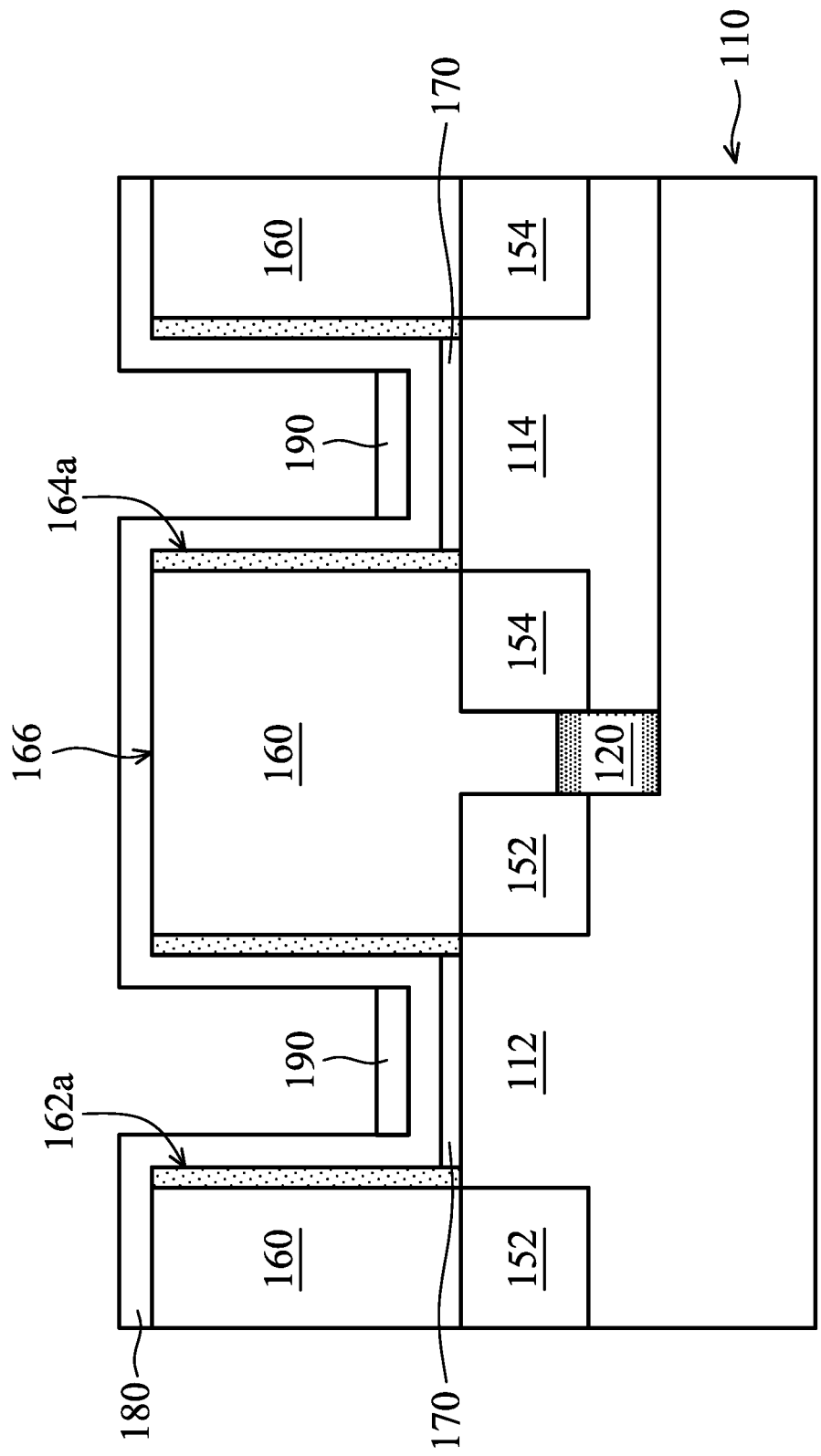

As shown in FIG. 2F, the oxidized mask layer 190b is removed, in accordance with some embodiments. The mask layer 190 is remained after the removal process, in accordance with some embodiments. The removal process includes an etching process, in accordance with some embodiments. The etching process uses an etching gas including a chlorine-containing gas, such as tantalum chloride ($TaCl_5$), in accordance with some embodiments. The etching process is performed at a temperature of between about 400° C. to about 500° C., in accordance with some embodiments.

Figure 2G:
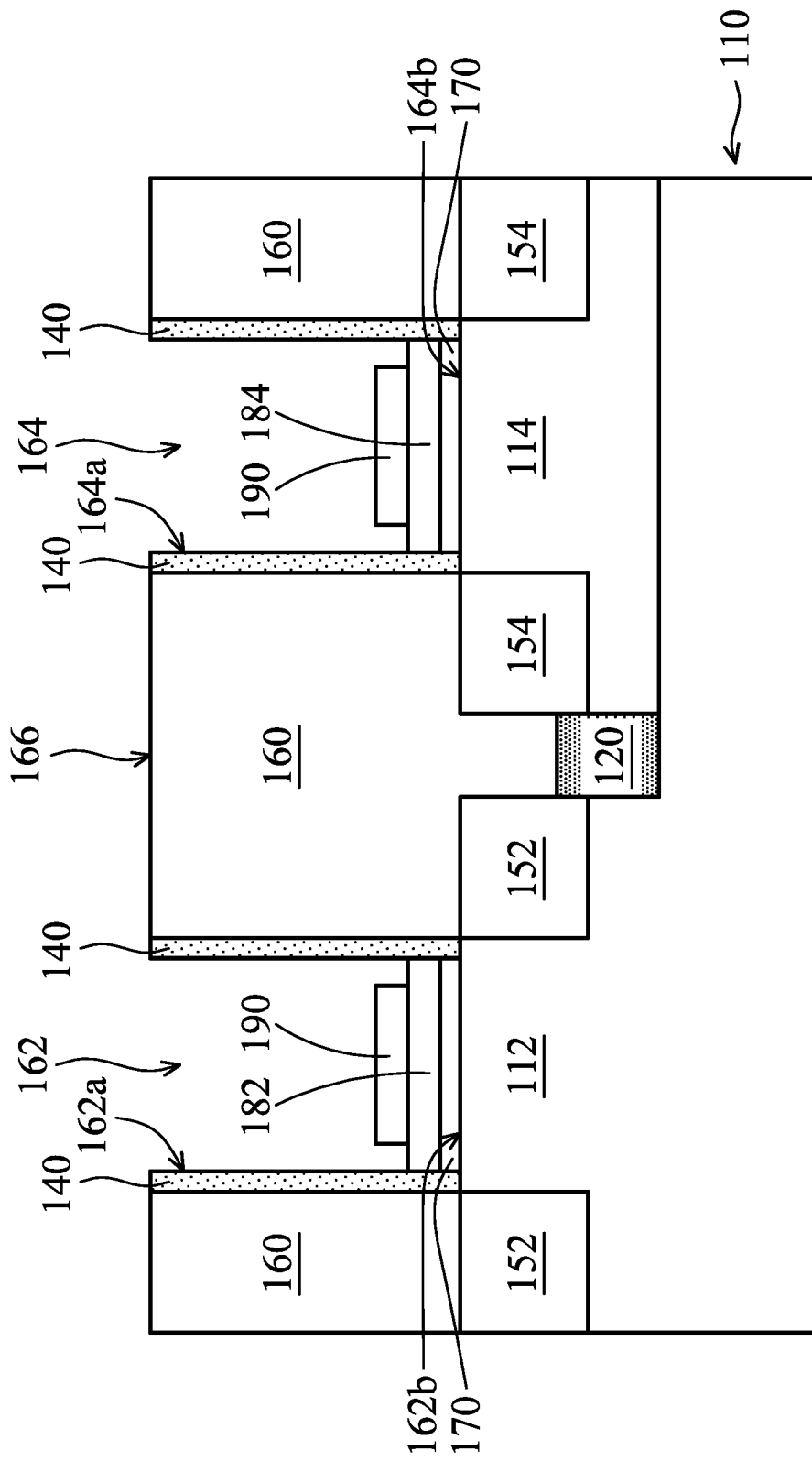

As shown in FIGS. 2F-2G, the gate dielectric layer 180 over the inner walls 162a and 164a and the top surface 166 is removed, in accordance with some embodiments. The remaining gate dielectric layer 180 includes a gate dielectric layer 182 in the trench 162 and a gate dielectric layer 184 in the trench 164, in accordance with some embodiments. The gate dielectric layers 182 and 184 are substantially flat layers, in accordance with some embodiments. The term "substantially flat" in the application may include small deviations from flat geometries. The deviations may be due to manufacturing processes.

The removal process includes an etching process, in accordance with some embodiments. The etching process uses an etching gas including a chlorine-containing gas, such as tungsten chloride ($WCl_5$), in accordance with some embodiments. The etching process is performed at a temperature of between about 400° C. to about 500° C., in accordance with some embodiments.

Figure 2H:
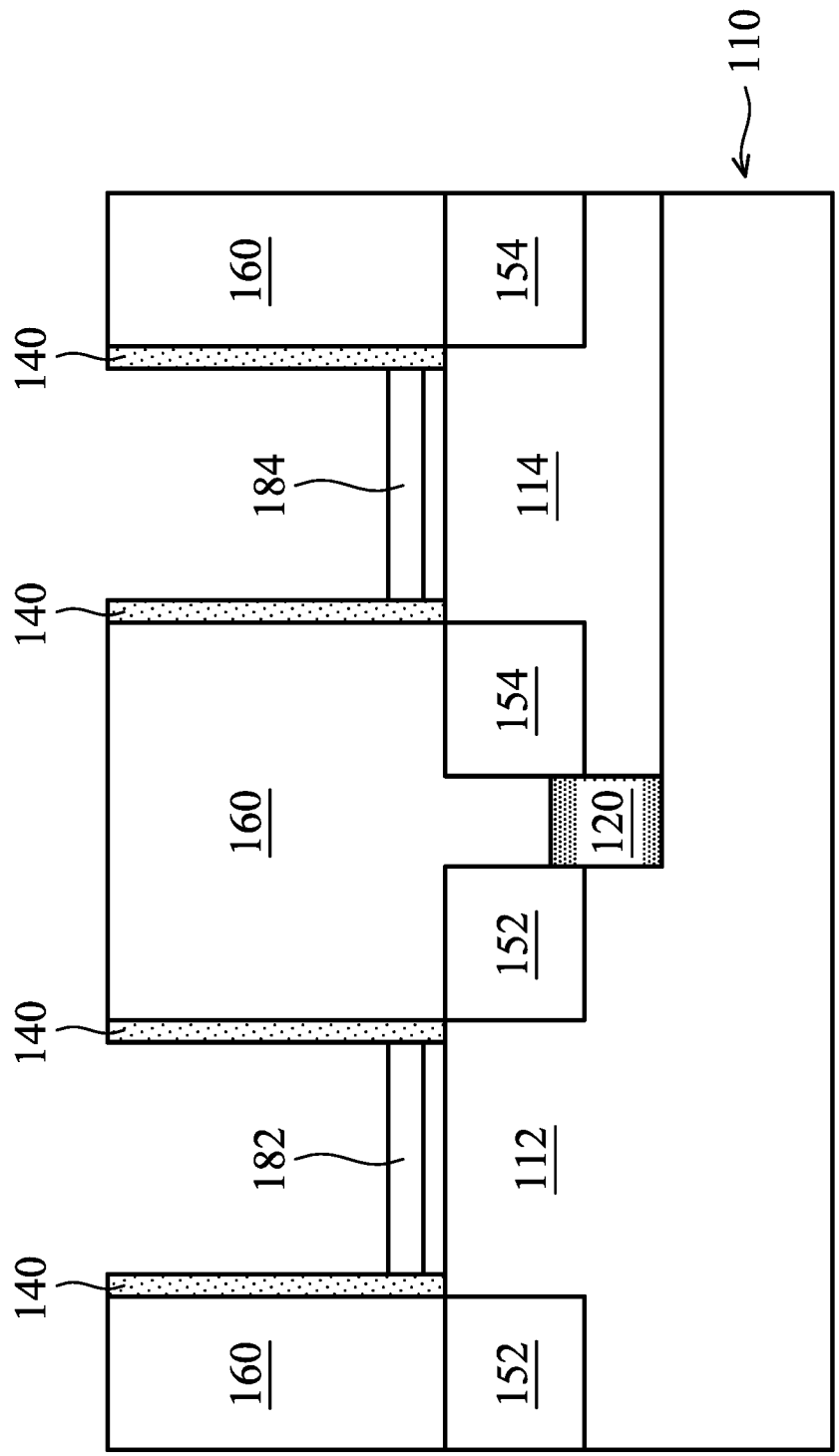

As shown in FIG. 2H, the mask layer 190 is removed, in accordance with some embodiments. The removal process includes an etching process, such as a wet etching process, in accordance with some embodiments. The wet etching process uses a standard clean-1 (SC1) solution, in accordance with some embodiments. The SC1 solution is a mixture of DI water, ammonium hydroxide ($NH_4OH$), and hydrogen peroxide ($H_2O_2$), in accordance with some embodiments. In some other embodiments, the wet etching process uses a standard clean-2 (SC2) solution. The SC2 solution is a mixture of deionized (DI) water, hydrochloric (HCl) acid, and hydrogen peroxide ($H_2O_2$), in accordance with some embodiments.

Figure 2I:
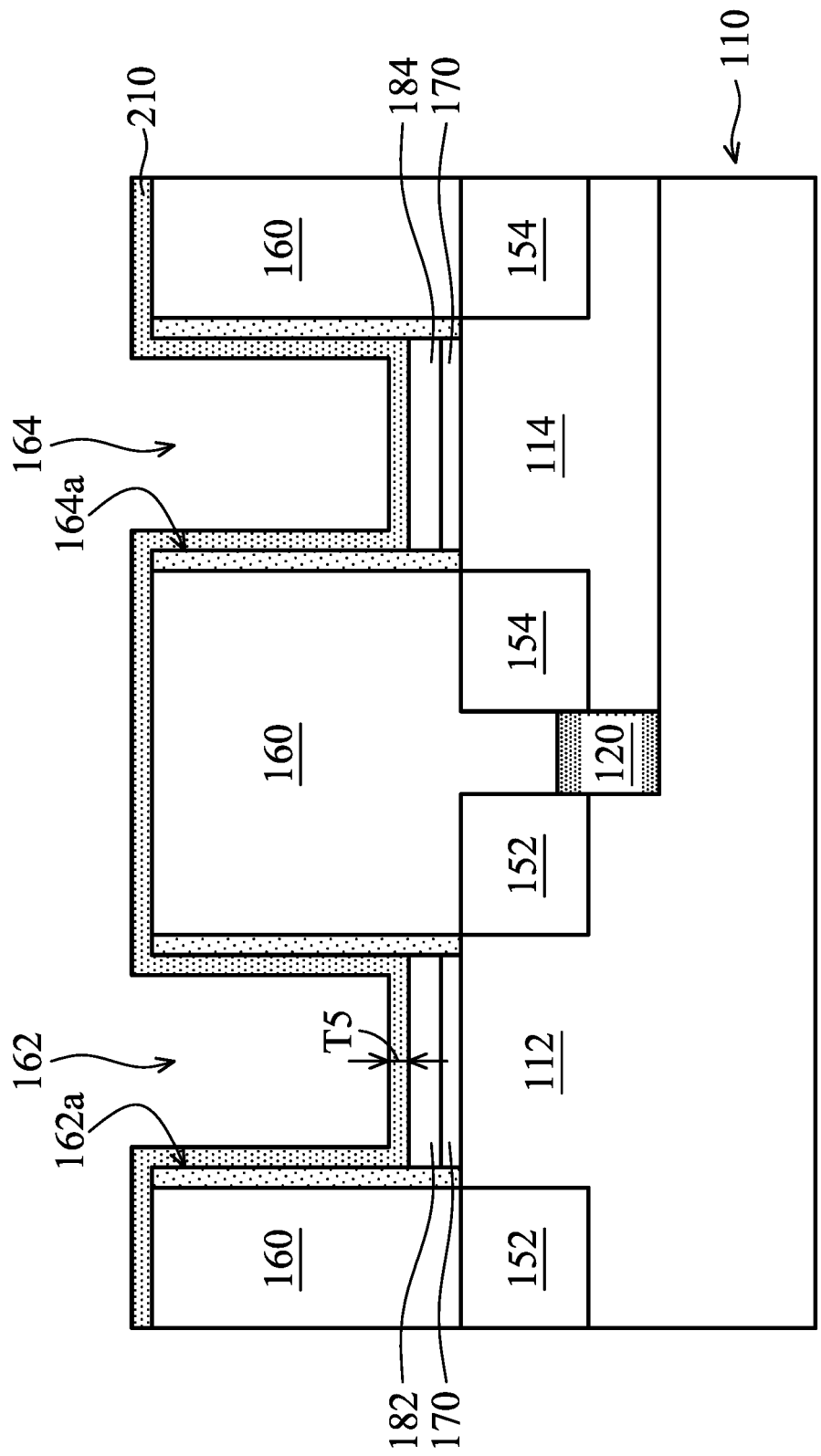

As shown in FIG. 2I, a repair layer 210 is formed over the inner walls 162a and 164a and the gate dielectric layers 182 and 184, in accordance with some embodiments. The repair layer 210 is used to provide nitrogen into the gate dielectric layers 182 and 184 to fill the oxygen vacancies in the gate dielectric layers 182 and 184 with nitrogen during subsequent annealing processes, in accordance with some embodiments.

The repair layer 210 has a thickness T5 ranging from about 10 Å to about 20 Å, in accordance with some embodiments. The repair layer 210 is made of a nitrogen-containing material, such as titanium silicon nitride (TiSiN), in accordance with some embodiments. The repair layer 210 is formed using an atomic layer deposition (ALD) process, a chemical vapor deposition process, or a physical vapor deposition process, in accordance with some embodiments.

In some embodiments, the repair layer 210 is formed using an atomic layer deposition process using $TiCl_4$, $SiH_4$ and $NH_3$ as a precursor. The atomic layer deposition process is performed at a temperature of between about 350° C. to about 450° C., in accordance with some embodiments.

Thereafter, an in-situ annealing process is performed over the repair layer 210 and the gate dielectric layers 182 and 184 to drive nitrogen into the gate dielectric layers 182 and 184, in accordance with some embodiments. The in-situ annealing process is performed at a temperature of about 850° C. to about 950° C. for about 1 second to about 30 seconds in a nitrogen ambient, in accordance with some embodiments.

Figure 2J:
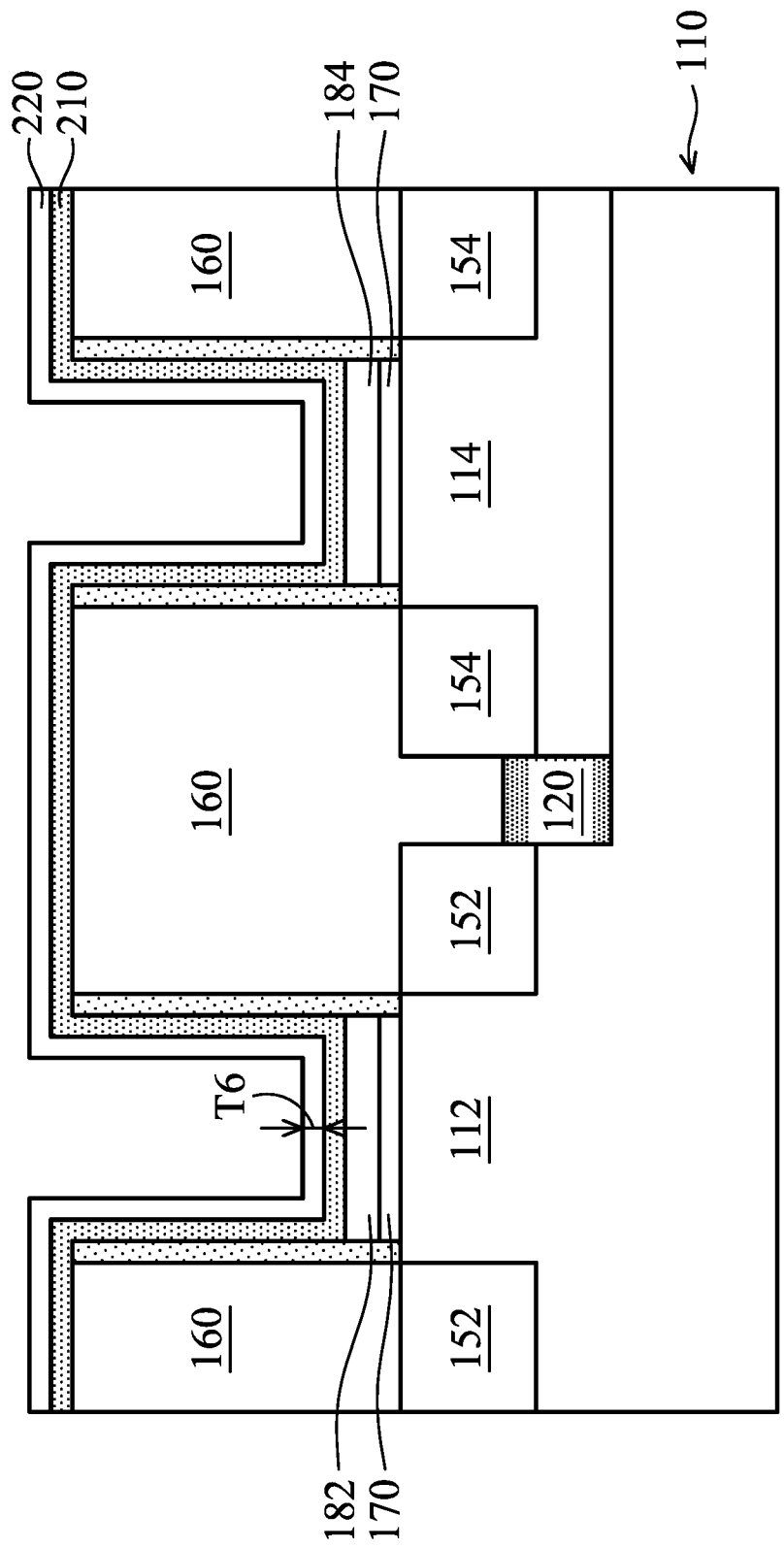

As shown in FIG. 2J, a cap layer 220 is formed over the repair layer 210, in accordance with some embodiments. The cap layer 220 is used to prevent oxygen from diffusing into and oxidizing the dielectric layer 170, in accordance with some embodiments. The cap layer 220 has a thickness T6 ranging from about 20 Å to about 50 Å, in accordance with some embodiments. The cap layer 220 is made of a semiconductor material, such as silicon, in accordance with some embodiments.

The cap layer 220 is formed using a chemical vapor deposition process, an atomic layer deposition process, or a physical vapor deposition process, in accordance with some embodiments. In some embodiments, the cap layer 220 is formed using a chemical vapor deposition process using $Si_2H_6$ and $H_2$ as a precursor. The chemical vapor deposition process is performed at a temperature of between about 350° C. to about 450° C., in accordance with some embodiments.

After the cap layer 220 is formed, an annealing process is performed over the cap layer 220, the dielectric layer 170 and the gate dielectric layers 182 and 184 to repair the crystal defects in the dielectric layer 170 and the gate dielectric layers 182 and 184 and to densify the dielectric layer 170 and the gate dielectric layers 182 and 184, in accordance with some embodiments. The annealing process is performed at a temperature of about 900° C. to about 950° C. for about 1 second to about 10 seconds in a nitrogen ambient, in accordance with some embodiments.

Figure 2K:
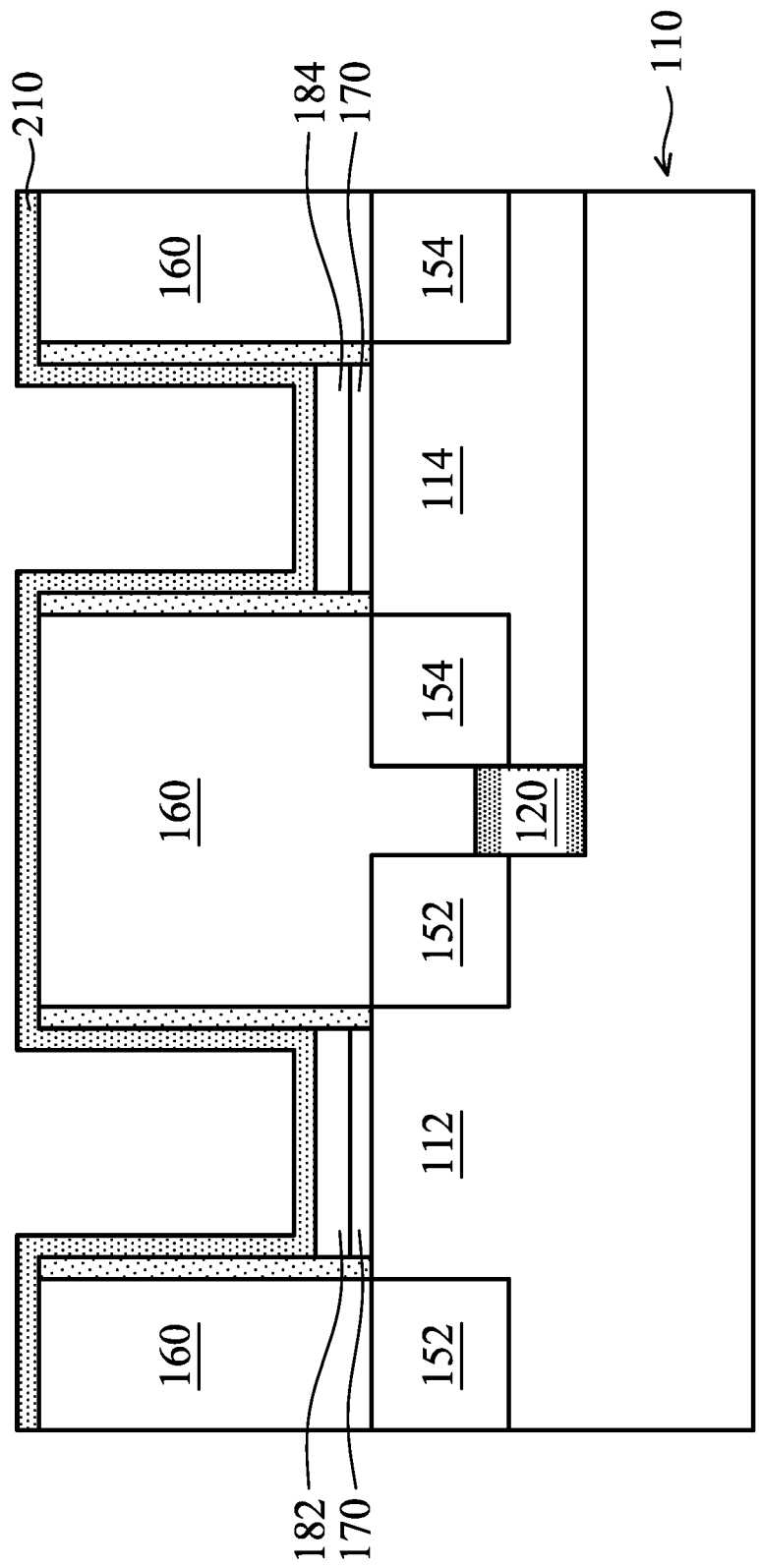

As shown in FIG. 2K, the cap layer 220 is removed, in accordance with some embodiments. The removal process includes an etching process, such as a dry etching process, a wet etching process, or a combination thereof, in accordance with some embodiments. The wet etching process uses a standard clean-1 (SC1) solution or a standard clean-2 (SC2) solution, in accordance with some embodiments.

The SC1 solution is a mixture of DI water, ammonium hydroxide ($NH_4OH$), and hydrogen peroxide ($H_2O_2$) at a mixture ratio of 5:1:1 of $DI:NH_4OH:H_2O_2$, in accordance with some embodiments. The SC2 solution is a mixture of deionized (DI) water, hydrochloric (HCl) acid, and hydrogen peroxide ($H_2O_2$) at a mixture ratio of 5:1:1 of $DI:HCl:H_2O_2$, in accordance with some embodiments.

Figure 2L:
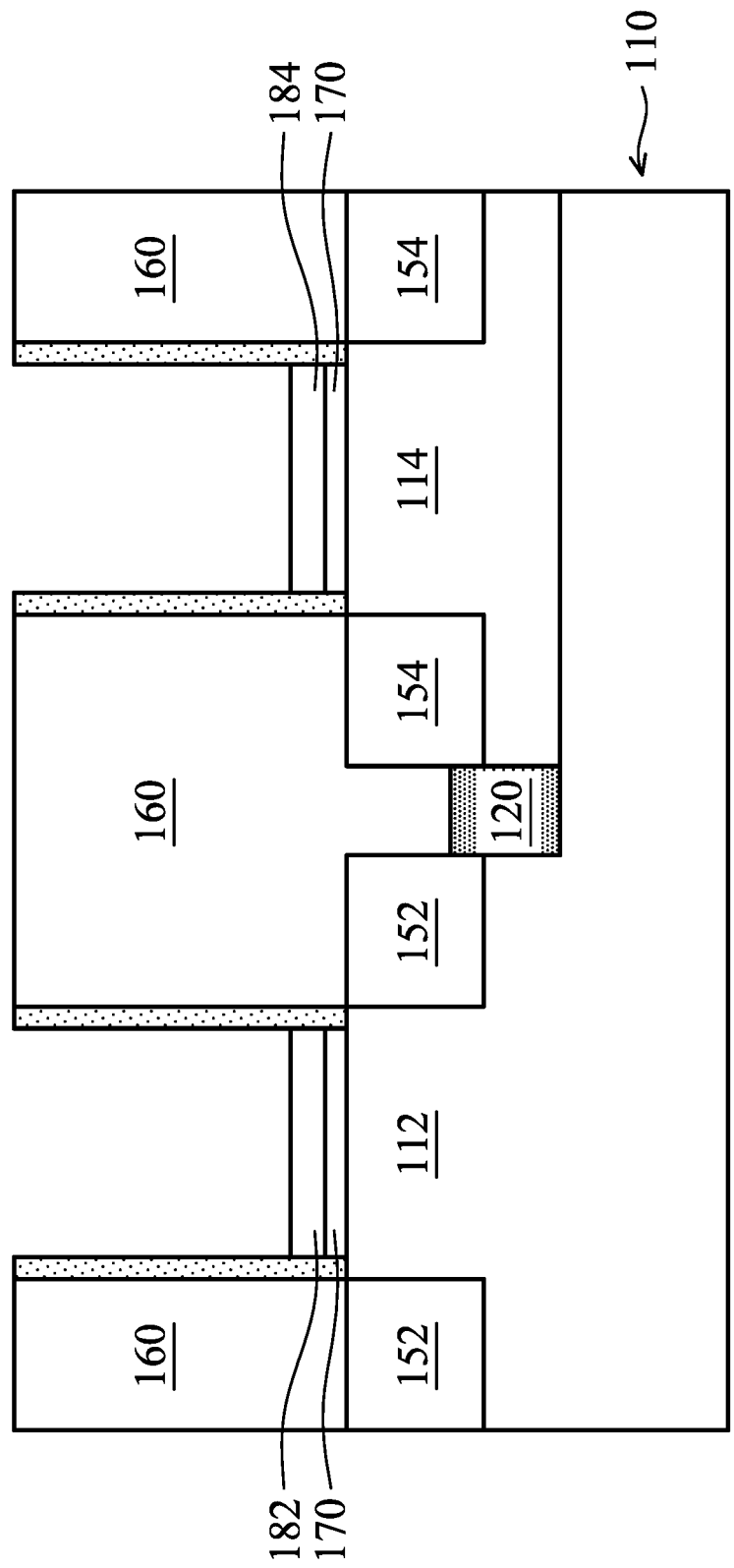

As shown in FIG. 2L, the repair layer 210 is removed, in accordance with some embodiments. The removal process includes an etching process, such as a wet etching process, in accordance with some embodiments. The wet etching process uses a standard clean-1 (SC1) solution or a standard clean-2 (SC2) solution, in accordance with some embodiments.

The SC1 solution is a mixture of DI water, ammonium hydroxide ($NH_4OH$), and hydrogen peroxide ($H_2O_2$), in accordance with some embodiments. The SC2 solution is a mixture of deionized (DI) water, hydrochloric (HCl) acid, and hydrogen peroxide ($H_2O_2$), in accordance with some embodiments.

After the repair layer 210 is removed, an annealing process is performed over the gate dielectric layers 182 and 184, in accordance with some embodiments. The annealing process is used to provide nitrogen into the gate dielectric layers 182 and 184 to fill the oxygen vacancies in the gate dielectric layers 182 and 184 with nitrogen. The annealing process is performed at a temperature of about 850° C. to about 950° C. for about 1 second to about 30 seconds in a nitrogen-containing ambient, such as an ammonia ($NH_3$) ambient, in accordance with some embodiments.

Figure 2M:
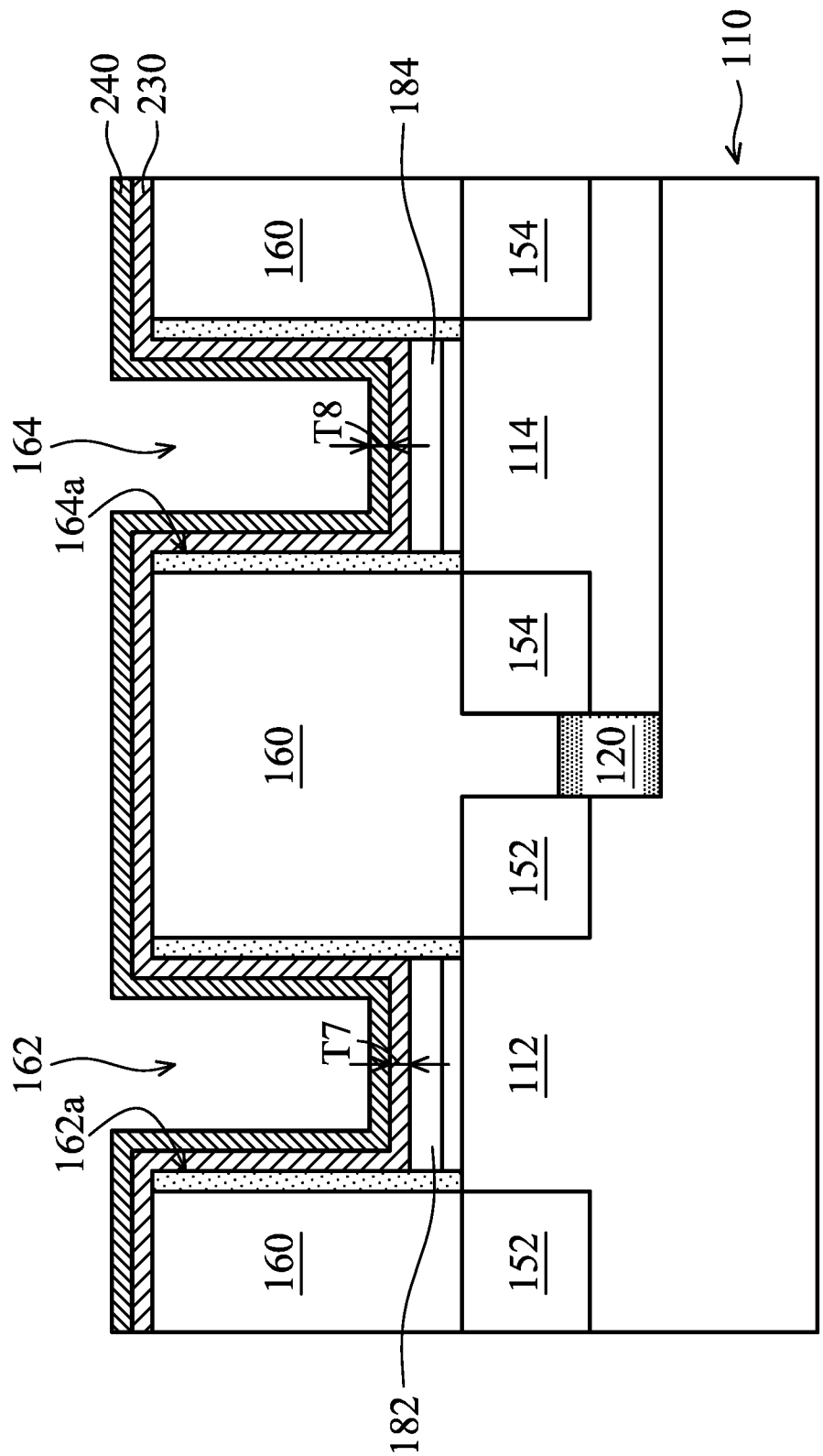

As shown in FIG. 2M, a work function layer 230 is formed over the inner walls 162a and 164a and the gate dielectric layers 182 and 184, in accordance with some embodiments. The work function layer 230 is made of a conductive material, such as an aluminum-containing material, in accordance with some embodiments. The aluminum-containing material includes titanium aluminum carbide (TiAlC), tantalum aluminum carbide (TaAlC), TiAl alloy, TaAl alloy, TiAlSi alloy, and/or TaAlSi alloy, in accordance with some embodiments.

The work function layer 230 has a thickness T7 ranging from about 15 Å to about 45 Å, in accordance with some embodiments. The work function layer 230 is formed using an atomic layer deposition (ALD) process, a chemical vapor deposition process, or a physical vapor deposition process, in accordance with some embodiments. In some embodiments, the work function layer 230 is formed using an atomic layer deposition process using $TiCl_4$ and triethylaluminum (TEAL) as a precursor. The atomic layer deposition process is performed at a temperature of between about 350° C. to about 450° C., in accordance with some embodiments.

As shown in FIG. 2M, a work function layer 240 is formed over the work function layer 230, in accordance with some embodiments. The work function layer 240 is made of a conductive material, such as a nitrogen-containing material, in accordance with some embodiments. The nitrogen-containing material includes TiN, WN, WCN, and/or TaN, in accordance with some embodiments.

The work function layer 240 has a thickness T8 ranging from about 10 Å to about 30 Å, in accordance with some embodiments. The work function layer 240 is formed using an in-situ atomic layer deposition (ALD) process, an in-situ chemical vapor deposition process, or an in-situ physical vapor deposition process, in accordance with some embodiments. That is, the work function layers 230 and 240 are formed in the same chamber to prevent the work function layer 230 from being oxidized during forming the work function layer 240, in accordance with some embodiments.

In some embodiments, the work function layer 240 is formed using an atomic layer deposition process using $TiCl_4$ and ammonia ($NH_3$) as a precursor. The atomic layer deposition process is performed at a temperature of between about 350° C. to about 450° C., in accordance with some embodiments.

Figure 2N:
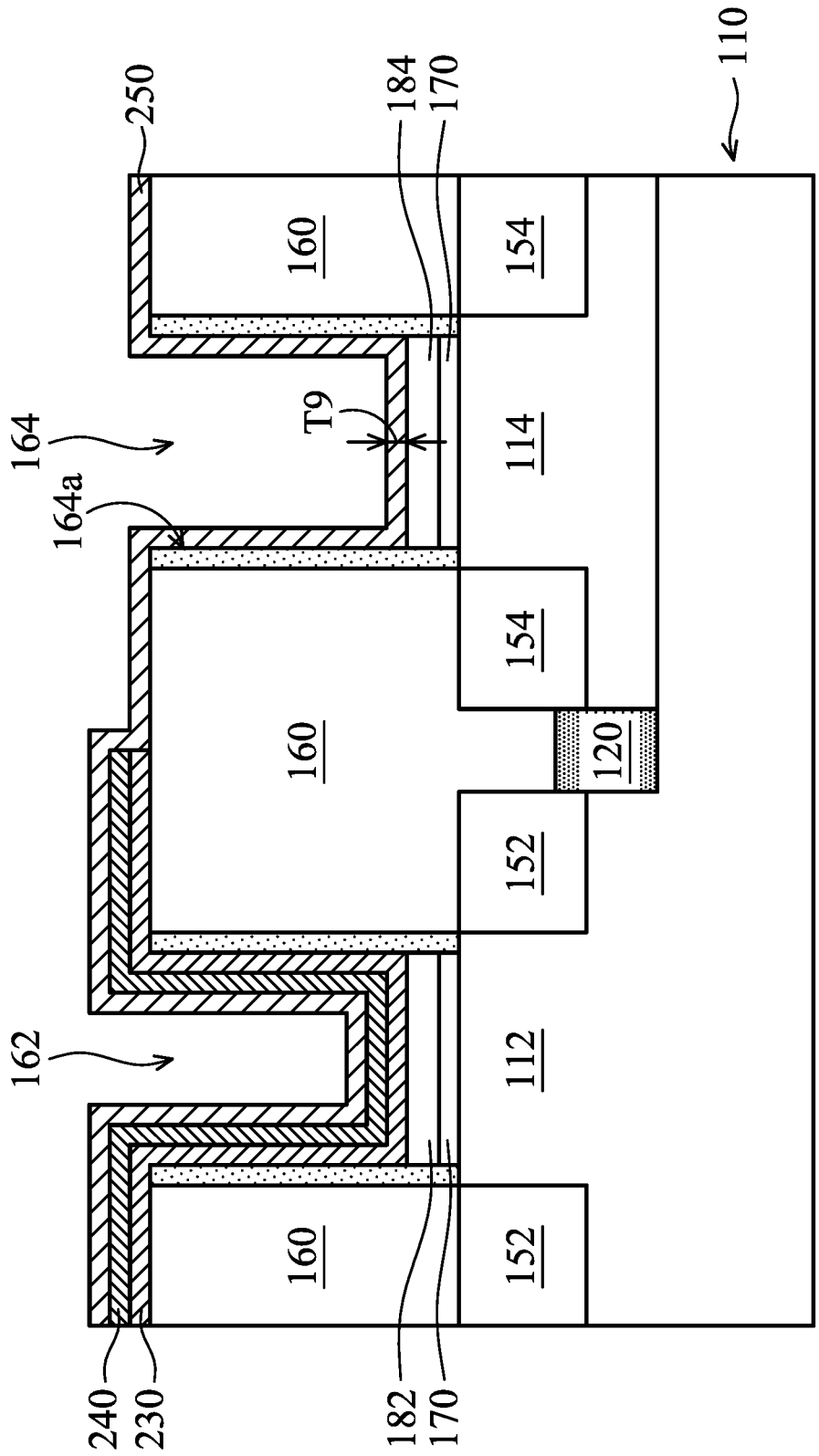

As shown in FIG. 2N, the work function layers 230 and 240 in the trench 164 are removed, in accordance with some embodiments. The removal process includes a photolithography process and an etching process, in accordance with some embodiments.

As shown in FIG. 2N, a work function layer 250 is formed over the inner walls 164a, the gate dielectric layer 184, the insulating layer 160, and the work function layer 240, in accordance with some embodiments. The work function layer 250 is made of a conductive material, such as a nitrogen-containing material, in accordance with some embodiments. The nitrogen-containing material includes TiN or WN, in accordance with some embodiments.

The work function layer 250 has a thickness T9 ranging from about 20 Å to about 40 Å, in accordance with some embodiments. In some embodiments, the work function layer 250 is formed using an atomic layer deposition process using $TiCl_4$ and ammonia ($NH_3$) as a precursor. The atomic layer deposition process is performed at a temperature of between about 350° C. to about 450° C., in accordance with some embodiments.

Figure 2O:
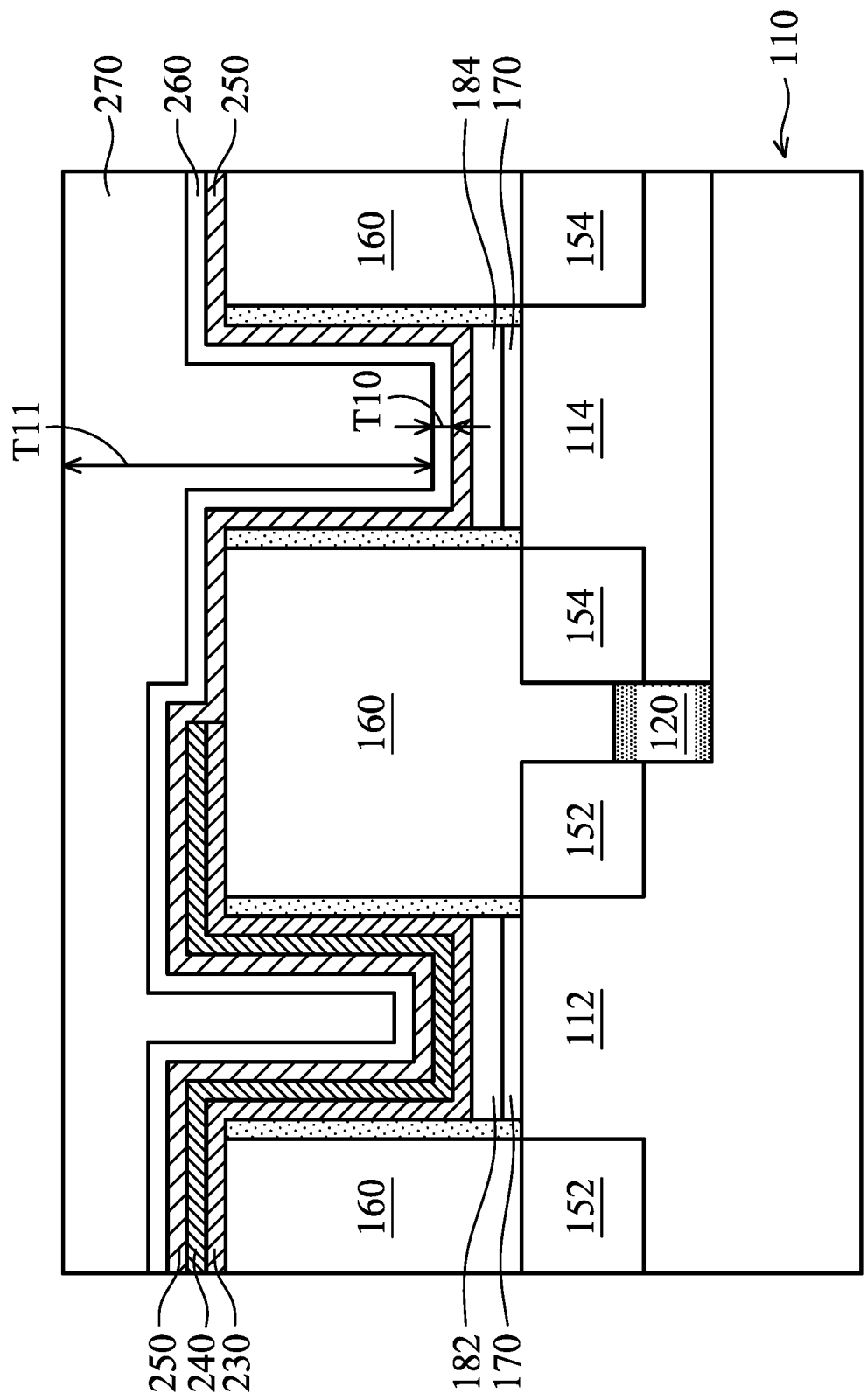
Figure 2P:
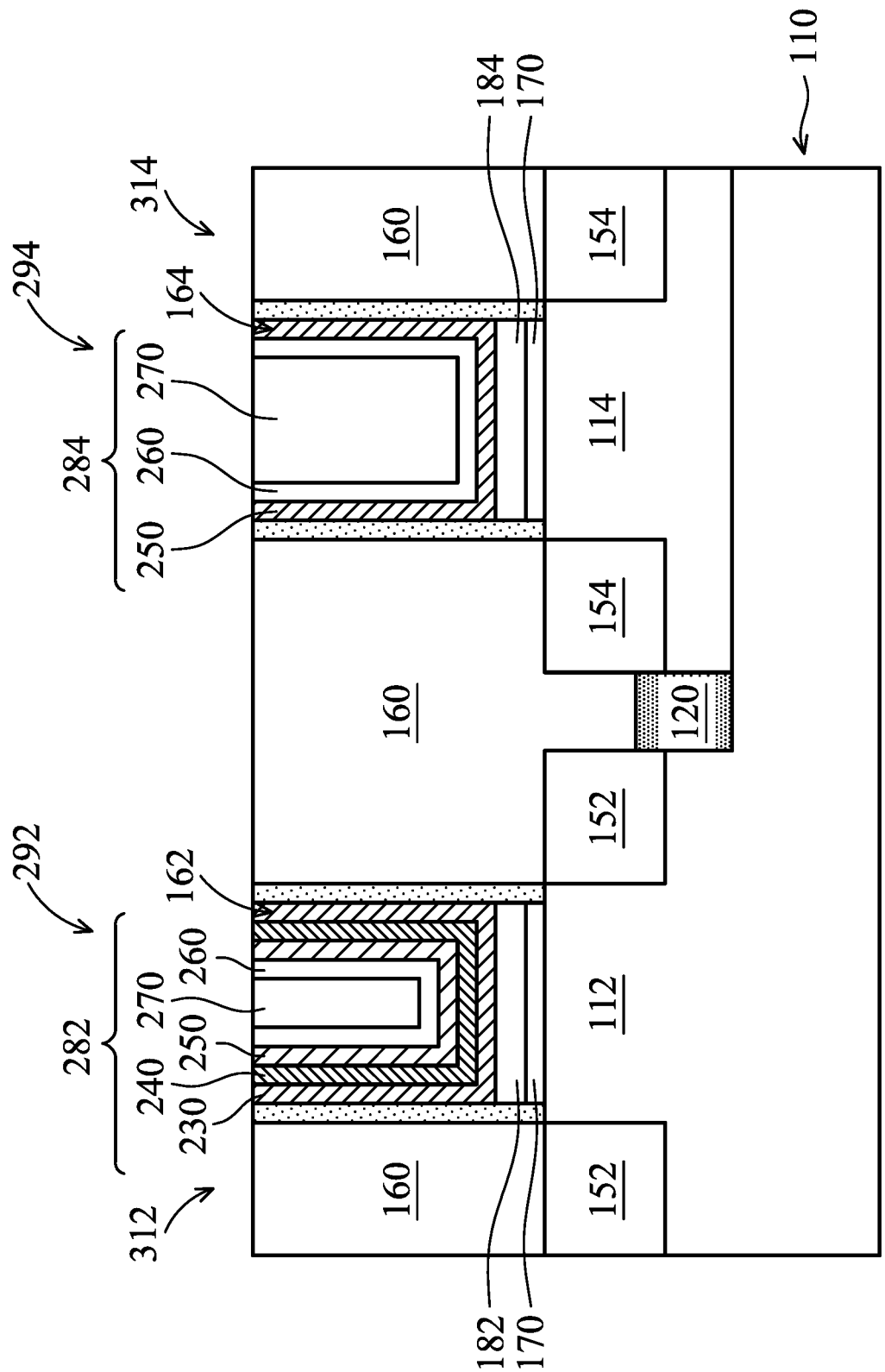

As shown in FIG. 2O, a gate electrode layer 260 is formed over the work function layer 250, in accordance with some embodiments. The gate electrode layer 260 is made of a conductive material, such as tungsten (e.g. fluorin-free tungsten), in accordance with some embodiments. The gate electrode layer 260 has a thickness T10 ranging from about 20 Å to about 40 Å, in accordance with some embodiments. In some embodiments, the gate electrode layer 260 is formed using an atomic layer deposition process using $WCl_5$ and $H_2$ as a precursor. The atomic layer deposition process is performed at a temperature of between about 400° C. to about 500° C., in accordance with some embodiments.

As shown in FIG. 2O, a gate electrode layer 270 is formed over the work function layer 260, in accordance with some embodiments. The gate electrode layer 270 is made of a conductive material, such as tungsten (e.g. low-fluorin tungsten), in accordance with some embodiments. The gate electrode layer 270 has a thickness T11 ranging from about 1000 Å to about 1500 Å, in accordance with some embodiments.

In some embodiments, the gate electrode layer 270 is formed using a chemical vapor deposition process using $WF_6$ and $H_2$ as a precursor. The chemical vapor deposition process is performed at a temperature of between about 300° C. to about 400° C., in accordance with some embodiments.

As shown in FIG. 2P, the work function layers 230, 240 and 250 and the gate electrode layers 260 and 270 outside of the trenches 162 and 164 are removed, in accordance with some embodiments. After the removal process, the work function layers 230, 240 and 250 and the gate electrode layers 260 and 270 remaining in the trench 162 together form a gate electrode 282, in accordance with some embodiments.

The gate electrode 282, the gate dielectric layer 182, and the dielectric layer 170 thereunder together form a gate stack 292, in accordance with some embodiments. The gate stack 292 and the stressors 152 together form an N-type transistor 312, in accordance with some embodiments.

The work function layer 250 and the gate electrode layers 260 and 270 remaining in the trench 164 together form a gate electrode 284, in accordance with some embodiments. The gate electrode 284, the gate dielectric layer 184, and the dielectric layer 170 thereunder together form a gate stack 294, in accordance with some embodiments. The gate stack 294 and the stressors 154 together form a P-type transistor 314, in accordance with some embodiments.

Figure 3:
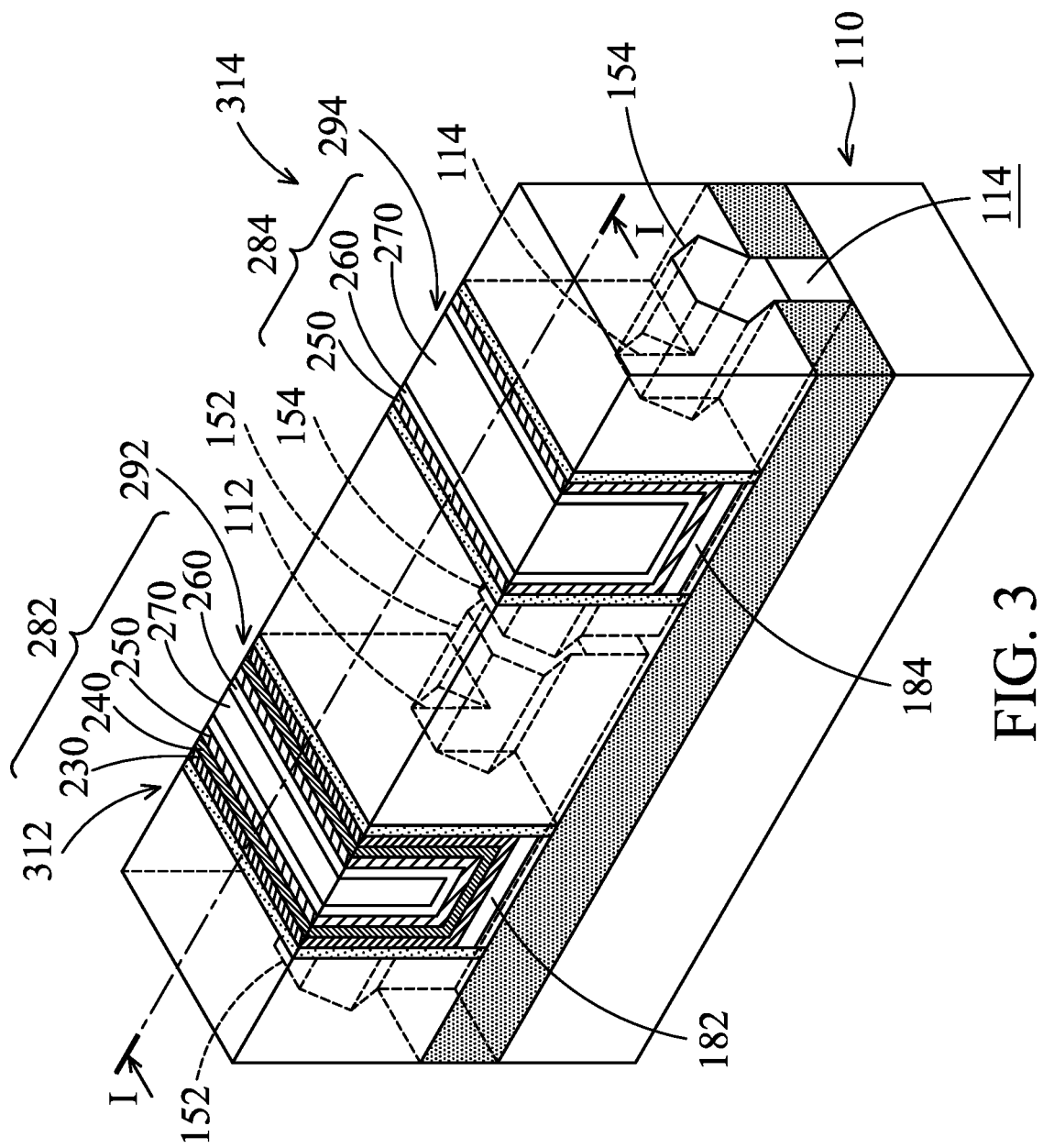
FIG. 3 is a perspective view of the semiconductor device structure of FIG. 2P, in accordance with some embodiments.

FIG. 3 is a perspective view of the semiconductor device structure of FIG. 2P, in accordance with some embodiments. FIG. 2P is a cross-sectional view illustrating the semiconductor device structure along a sectional line I-I in FIG. 3, in accordance with some embodiments. As shown in FIGS. 2P and 3, the gate stack 292 wraps around the upper portion of the fin structure 112, in accordance with some embodiments. The gate stack 294 wraps around the upper portion of the fin structure 114, in accordance with some embodiments.

The gate dielectric layer 180 over the inner walls 162a and 164a of the trenches 162 and 164 is removed to form the gate dielectric layers 182 and 184 only over the bottoms 162b and 164b and not over the inner walls 162a and 164a (as shown in FIGS. 2F-2G), in accordance with some embodiments. Therefore, the work function layers 230, 240 and 250 and the gate electrode layers 260 and 270 are smoothly formed in the trench 162, and the work function layer 250 and the gate electrode layers 260 and 270 are smoothly formed in the trench 164 without being blocked by the gate dielectric layers 182 and 184. As a result, the yield of the N-type transistor 312 and the P-type transistor 314 are improved, in accordance with some embodiments.

Figure 4A:
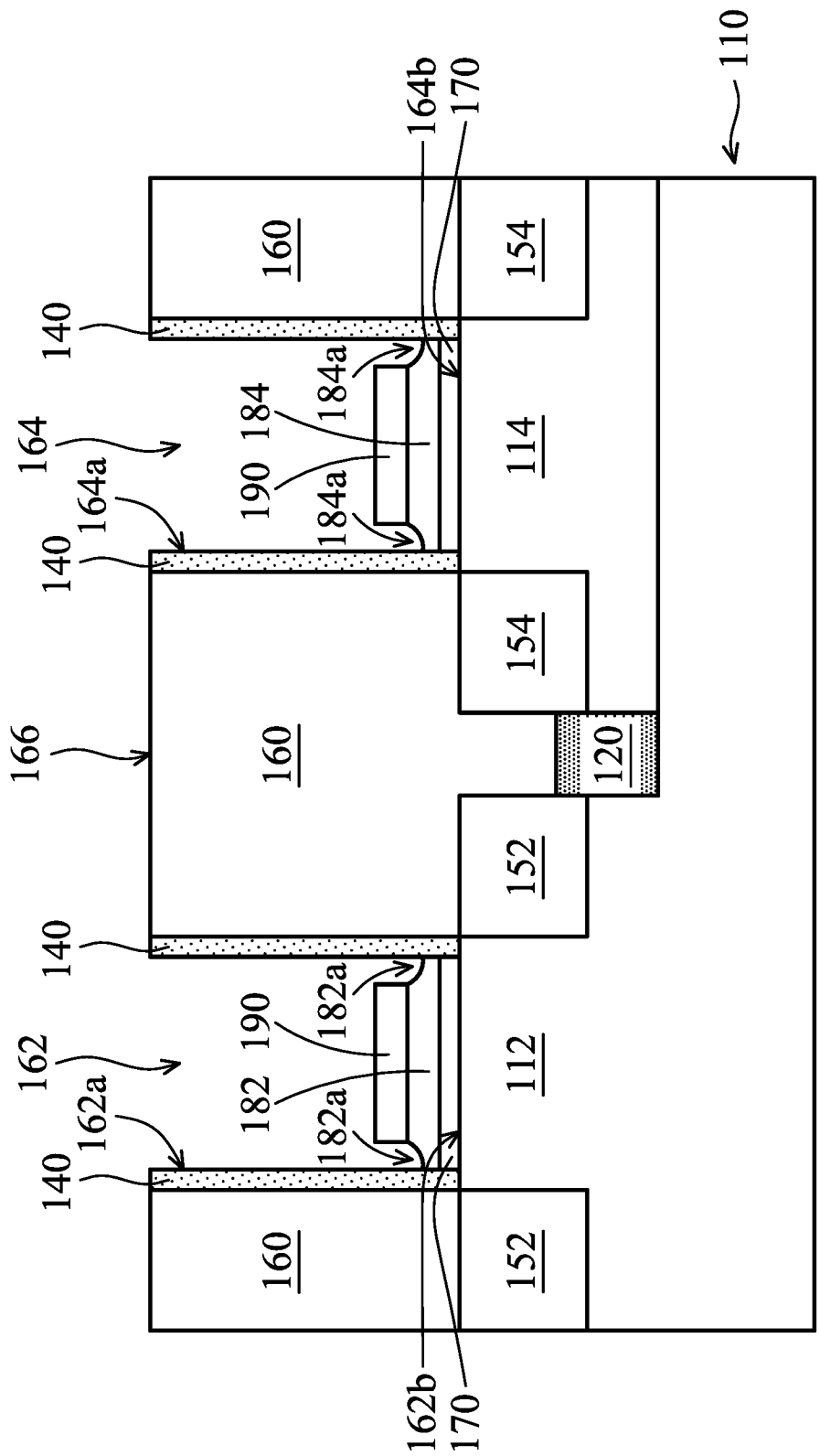
FIGS. 4A-4D are cross-sectional views of various stages of a process for forming a semiconductor device structure, in accordance with some embodiments.

FIGS. 4A-4D are cross-sectional views of various stages of a process for forming a semiconductor device structure, in accordance with some embodiments. As shown in FIG. 4A, after the step of 2F, the gate dielectric layer 180 over the inner walls 162a and 164a and the top surface 166 is removed, in accordance with some embodiments.

The removal process further removes a portion of the gate dielectric layer 180 over the bottoms 162b and 164b, in accordance with some embodiments. The remaining gate dielectric layer 180 includes a gate dielectric layer 182 in the trench 162 and a gate dielectric layer 184 in the trench 164, in accordance with some embodiments.

The removal process forms a recess 182a in the gate dielectric layer 182, in accordance with some embodiments. The recess 182a continuously surrounds the entire mask layer 190 in the trench 162, in accordance with some embodiments. The removal process forms a recess 184a in the gate dielectric layer 184, in accordance with some embodiments. The recess 184a continuously surrounds the entire mask layer 190 in the trench 164, in accordance with some embodiments. The removed portion is adjacent to and not covered by the mask layer 190, in accordance with some embodiments.

Figure 4B:
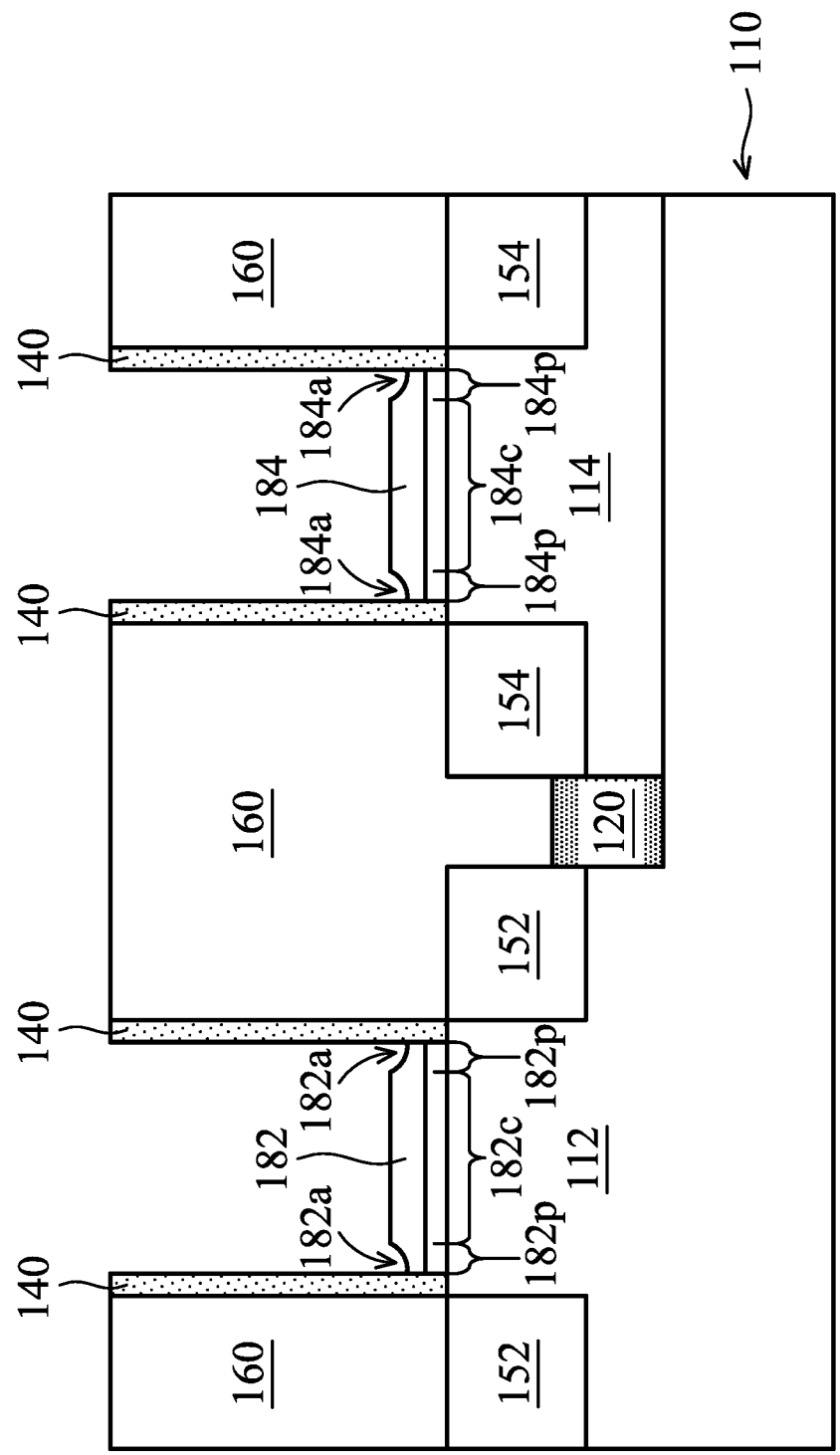
Figure 5:
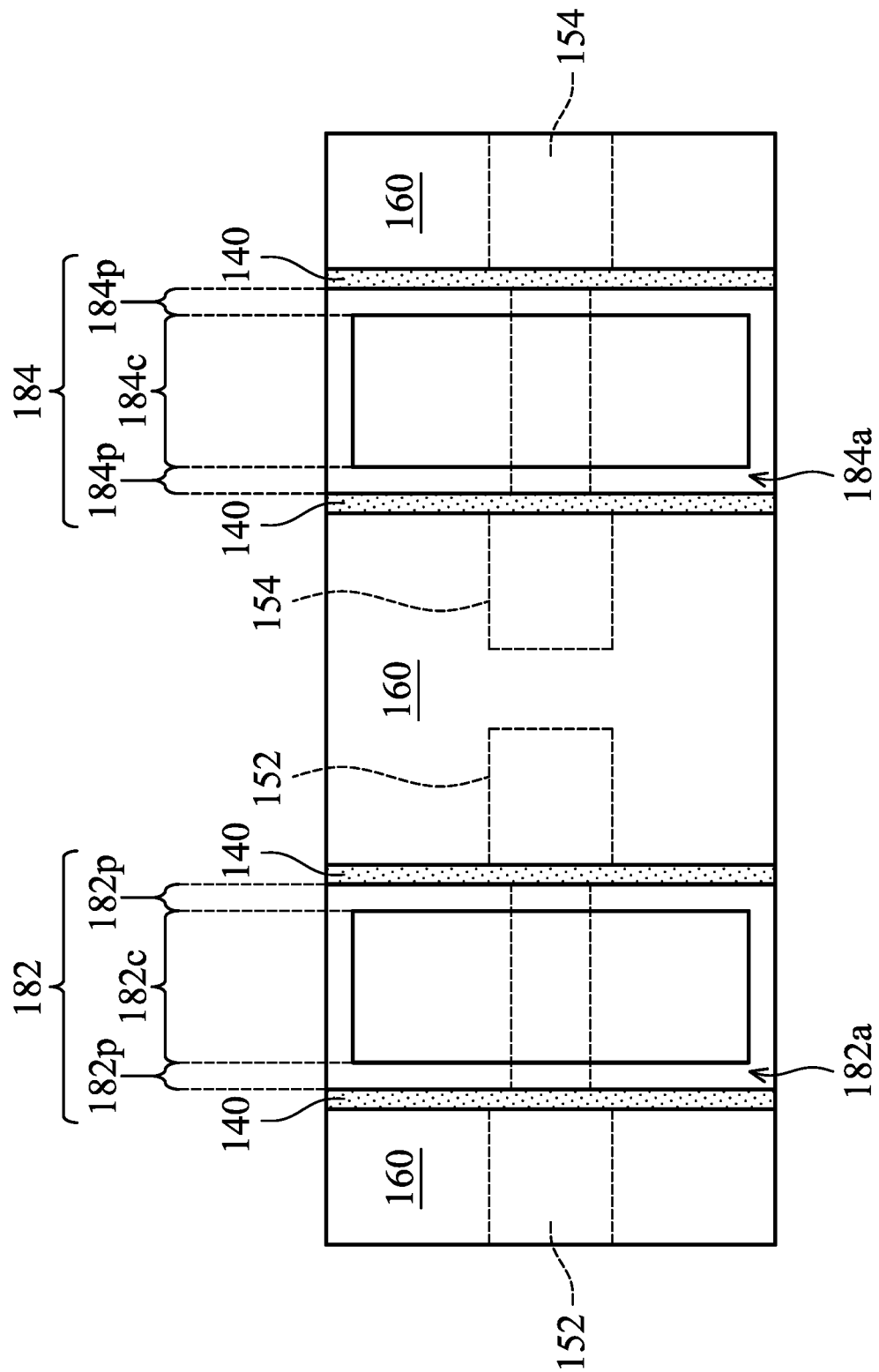
FIG. 5 is a top view of the semiconductor device structure of FIG. 4B, in accordance with some embodiments.

As shown in FIG. 4B, the mask layer 190 is removed, in accordance with some embodiments. FIG. 5 is a top view of the semiconductor device structure of FIG. 4B, in accordance with some embodiments. As shown in FIGS. 4B and 5, the gate dielectric layer 182 has a central portion 182c and a peripheral portion 182p surrounding the central portion 182c, in accordance with some embodiments. The recess 182a is formed in the peripheral portion 182p, in accordance with some embodiments. The recess 182a continuously surrounds the central portion 182c, in accordance with some embodiments.

As shown in FIGS. 4B and 5, the gate dielectric layer 184 has a central portion 184c and a peripheral portion 184p surrounding the central portion 184c, in accordance with some embodiments. The recess 184a is formed in the peripheral portion 184p, in accordance with some embodiments. The recess 184a continuously surrounds the central portion 184c, in accordance with some embodiments.

Figure 4C:
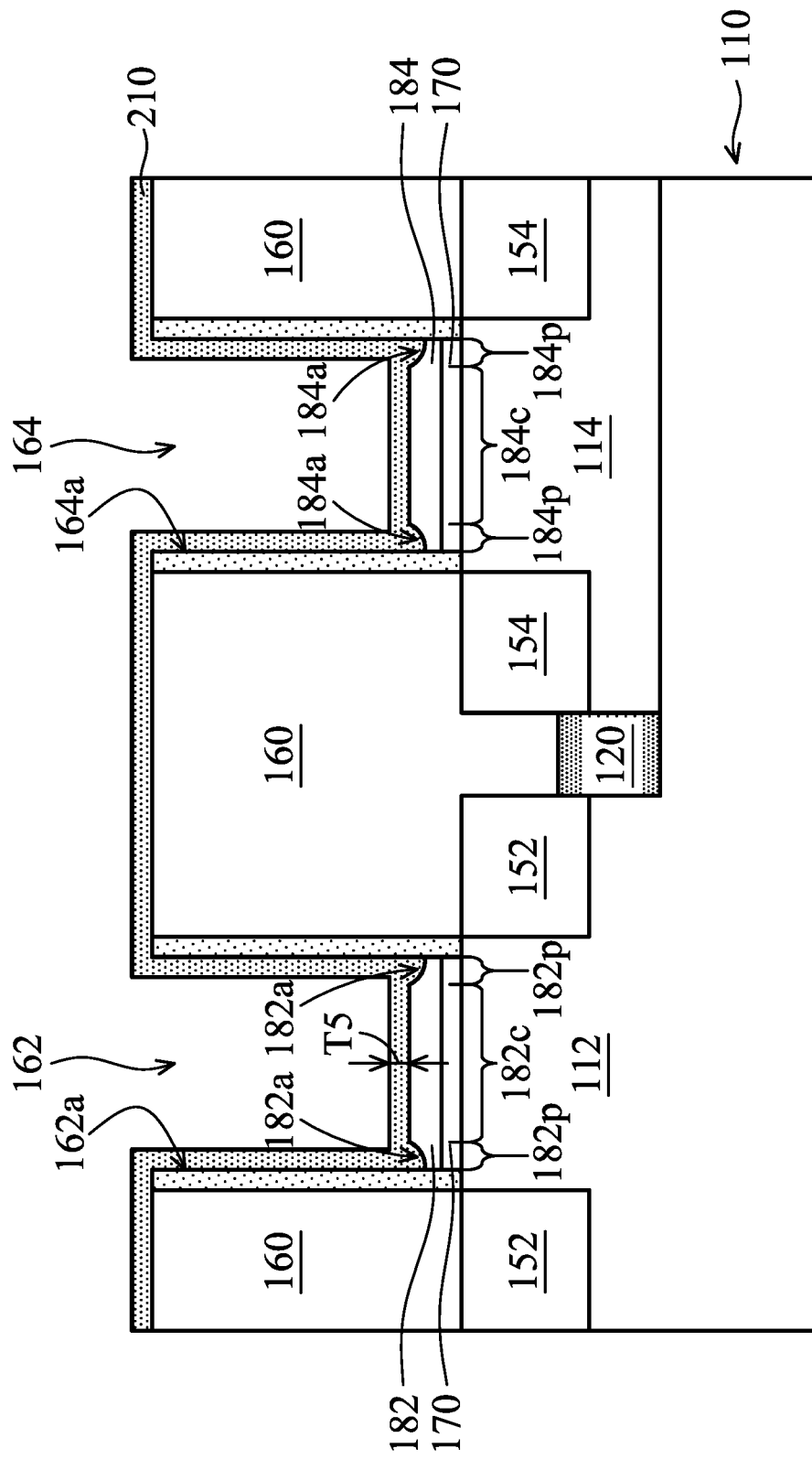

As shown in FIG. 4C, a repair layer 210 is formed over the inner walls 162a and 164a and the gate dielectric layers 182 and 184, in accordance with some embodiments. The repair layer 210 fills the recesses 182a and 184a, in accordance with some embodiments. The forming methods and the materials of the repair layer 210 are similar to or the same as that of the repair layer 210 of FIG. 2I, in accordance with some embodiments.

Figure 4D:
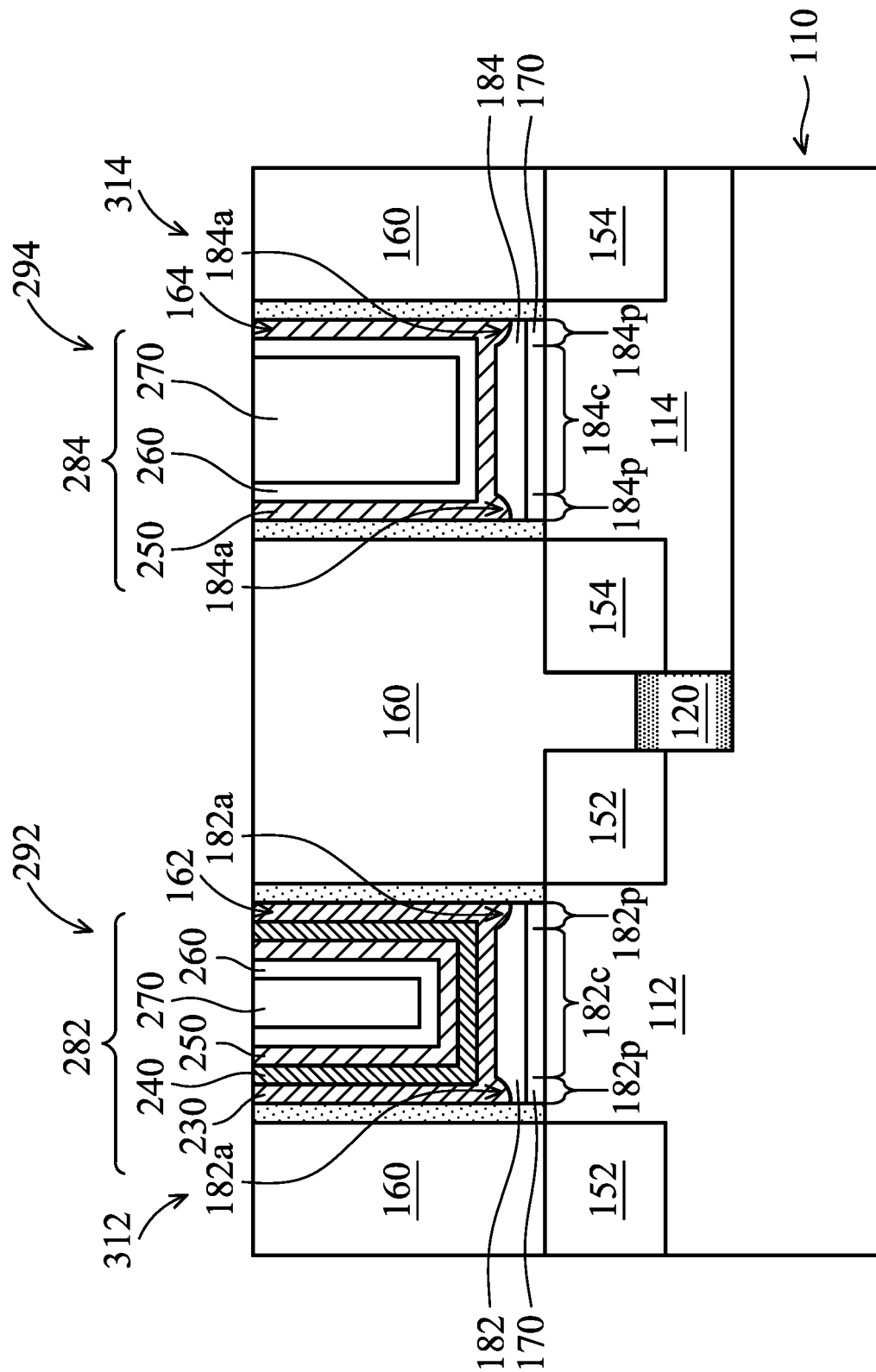
Figure 6:
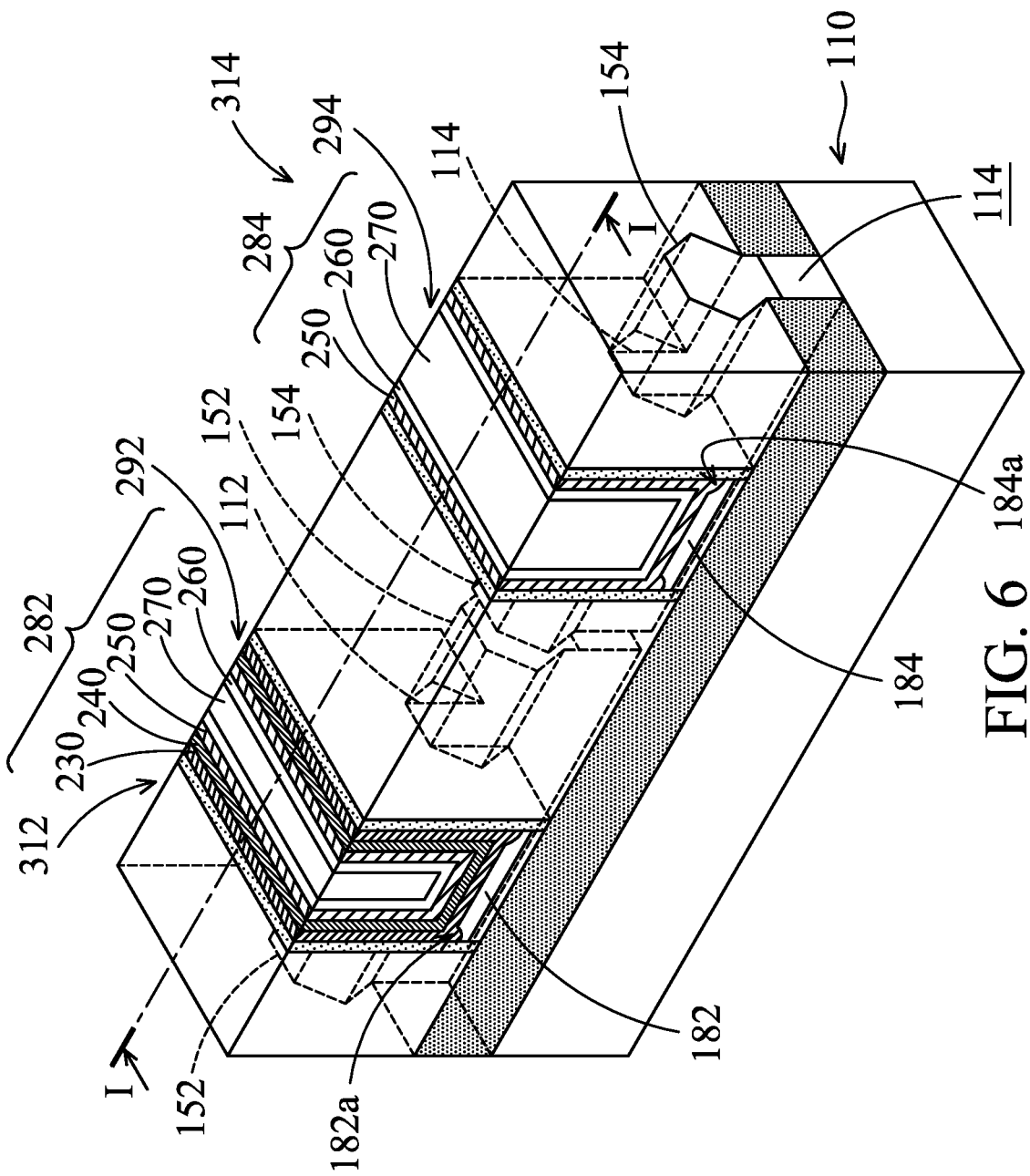
FIG. 6 is a perspective view of the semiconductor device structure of FIG. 4D, in accordance with some embodiments.

FIG. 6 is a perspective view of the semiconductor device structure of FIG. 4D, in accordance with some embodiments. FIG. 4D is a cross-sectional view illustrating the semiconductor device structure along a sectional line I-I in FIG. 6, in accordance with some embodiments.

As shown in FIGS. 4D and 6, the steps of FIGS. 2J-2P are performed, in accordance with some embodiments. The work function layer 230 fills the recesses 182a and 184a, in accordance with some embodiments. That is, portions of the work function layer 230 extend into the peripheral portions 182p of the gate dielectric layer 182 and into the peripheral portions 184p of the gate dielectric layer 184, in accordance with some embodiments.

The portions of the work function layer 230 in the peripheral portions 182p surround the central portion 182c of the gate dielectric layer 182, in accordance with some embodiments. The portions of the work function layer 230 in the peripheral portions 184p surround the central portion 184c of the gate dielectric layer 184, in accordance with some embodiments.

Figure 7A:
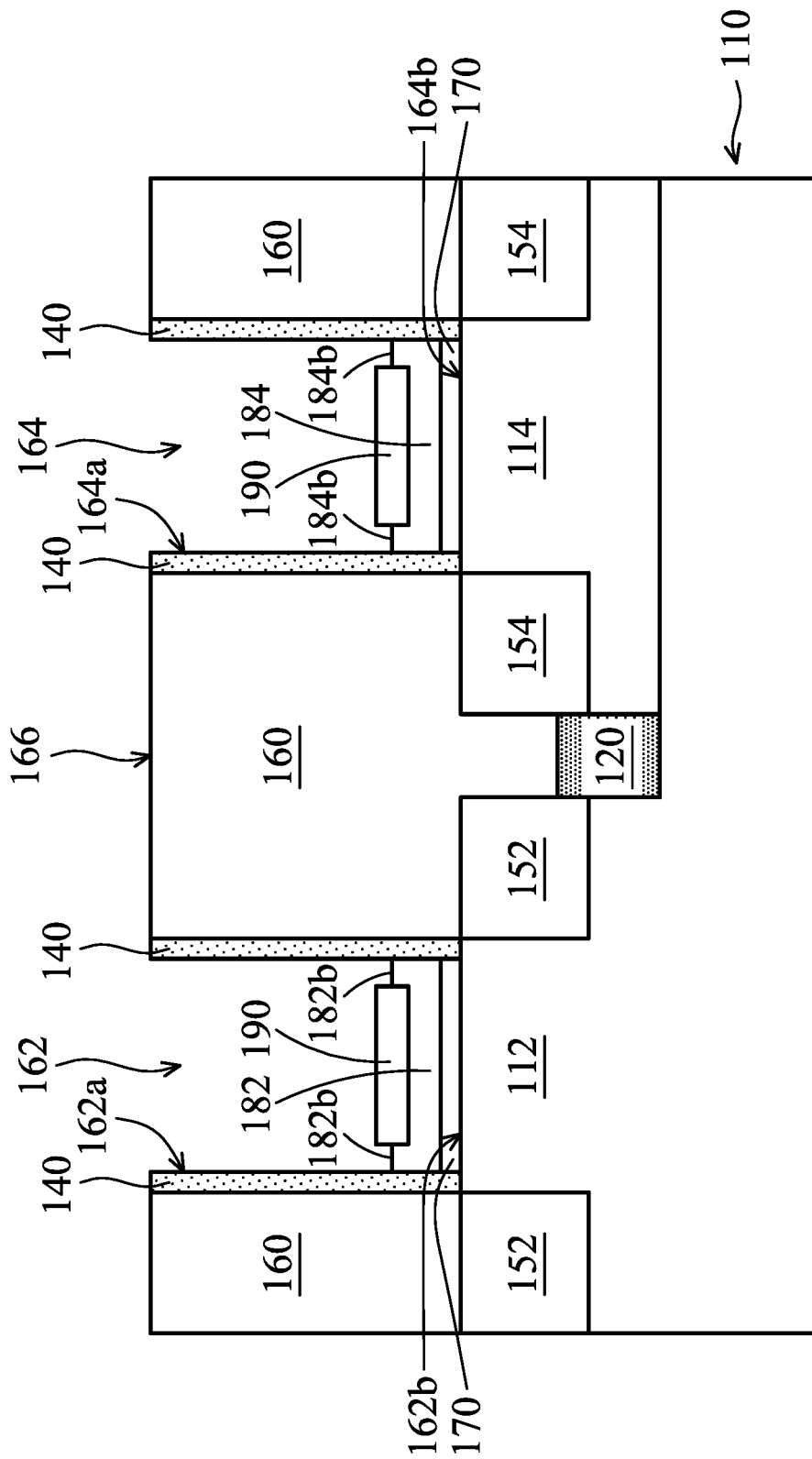
FIGS. 7A-7B are cross-sectional views of various stages of a process for forming a semiconductor device structure, in accordance with some embodiments.
Figure 7B:
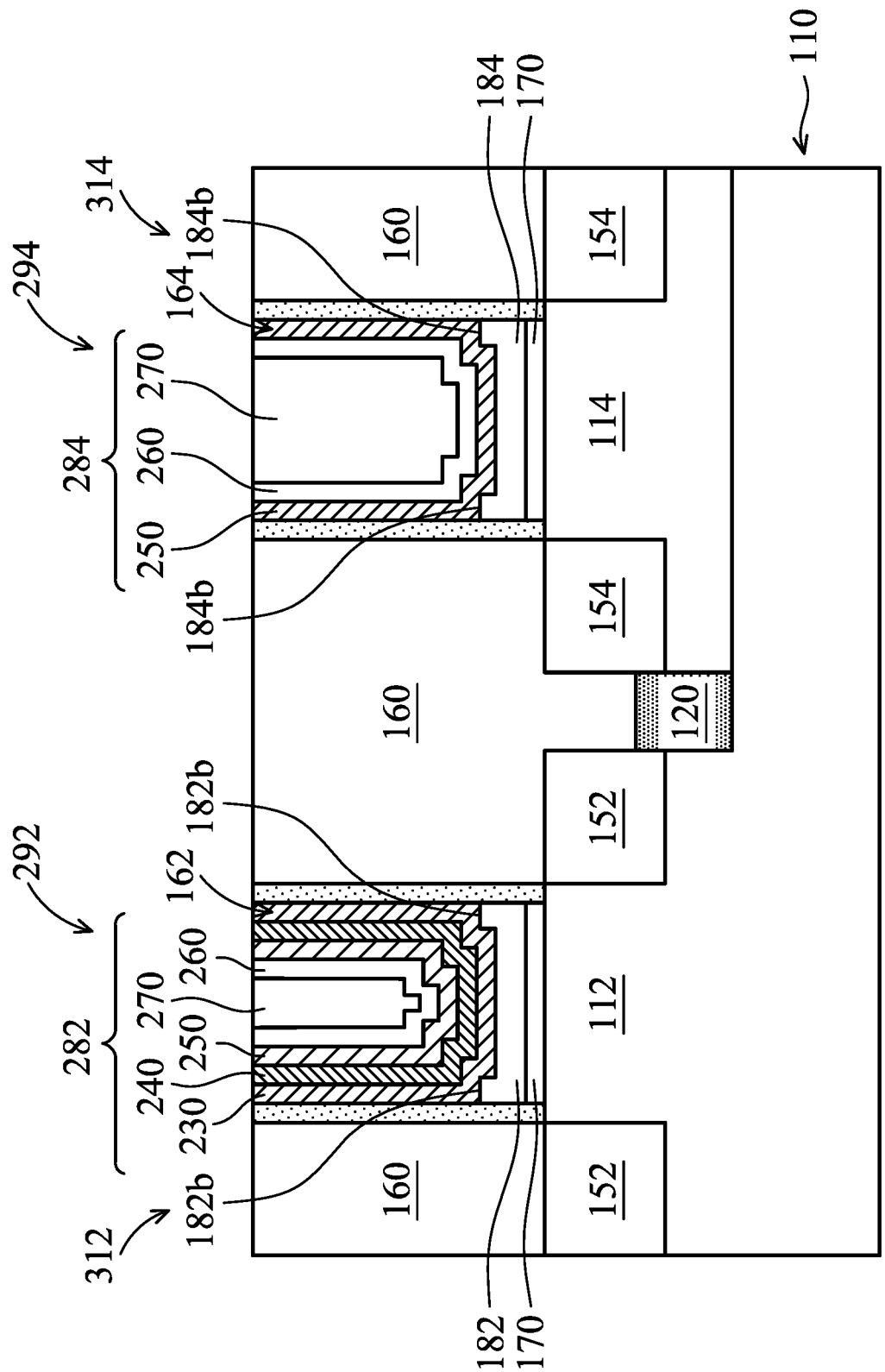

FIGS. 7A-7B are cross-sectional views of various stages of a process for forming a semiconductor device structure, in accordance with some embodiments. As shown in FIG. 7A, after the step of 2F, the gate dielectric layer 180 over the inner walls 162a and 164a is partially removed, and the gate dielectric layer 180 over the top surface 166 is removed, in accordance with some embodiments.

The remaining gate dielectric layer 180 includes a gate dielectric layer 182 in the trench 162 and a gate dielectric layer 184 in the trench 164, in accordance with some embodiments. As shown in FIG. 7A, in the trench 162, a portion 182b of the gate dielectric layer 182 is between the mask layer 190 and the spacers 140, in accordance with some embodiments. As shown in FIG. 7A, in the trench 164, a portion 184b of the gate dielectric layer 184 is between the mask layer 190 and the spacers 140, in accordance with some embodiments.

Figure 8:
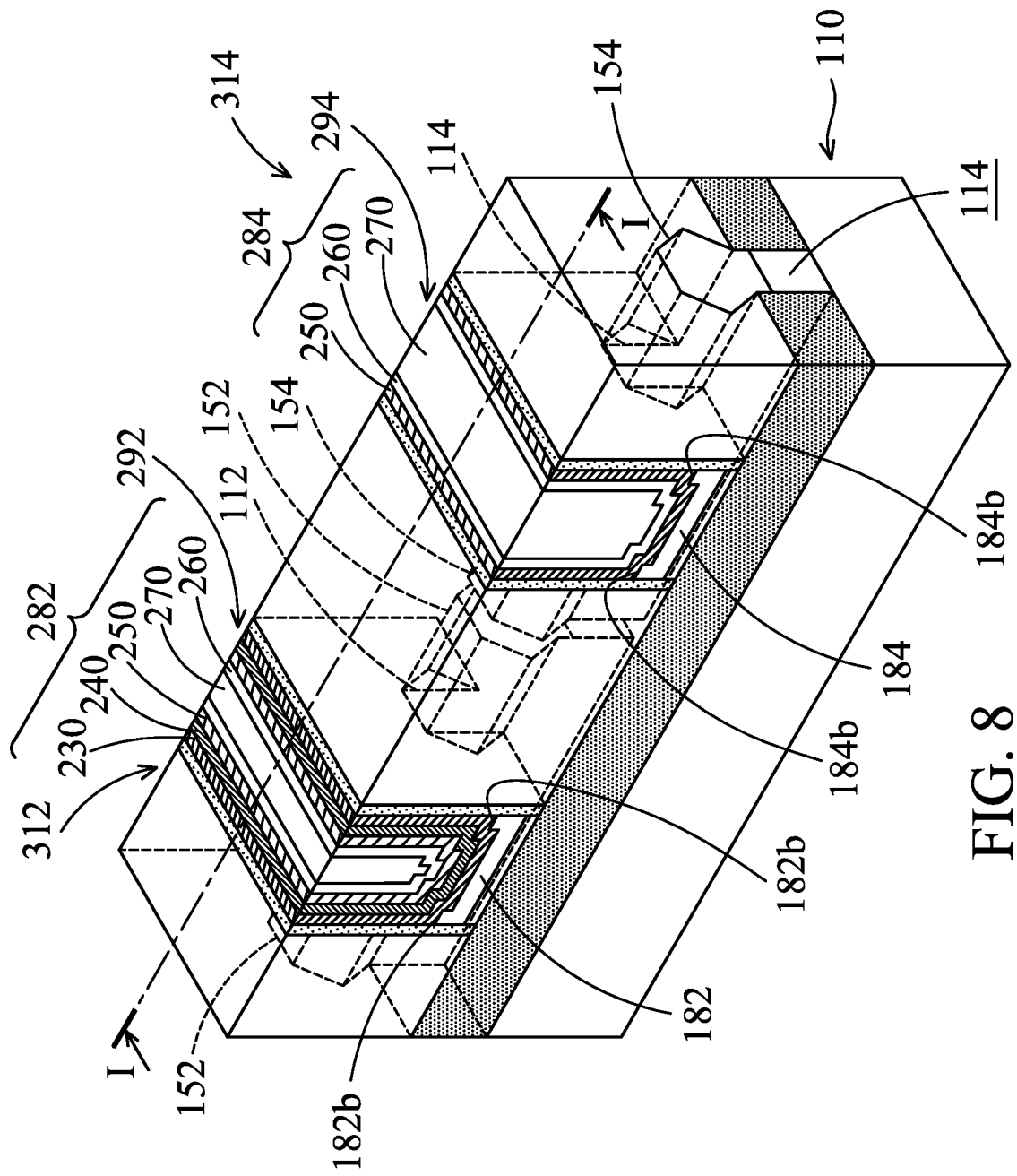
FIG. 8 is a perspective view of the semiconductor device structure of FIG. 7B, in accordance with some embodiments.

FIG. 8 is a perspective view of the semiconductor device structure of FIG. 7B, in accordance with some embodiments. FIG. 7B is a cross-sectional view illustrating the semiconductor device structure along a sectional line I-I in FIG. 8, in accordance with some embodiments. As shown in FIGS. 7B and 8, the steps of FIGS. 2H-2P are performed, in accordance with some embodiments. In the trench 162, the work function layer 230 conformally covers the gate dielectric layer 182, in accordance with some embodiments. The work function layer 230 covers an entire top surface of the gate dielectric layer 182, in accordance with some embodiments. In the trench 164, the work function layer 250 conformally covers the gate dielectric layer 184, in accordance with some embodiments. The work function layer 250 covers an entire top surface of the gate dielectric layer 184, in accordance with some embodiments.

In accordance with some embodiments, semiconductor device structures and methods for forming the same are provided. The methods (for forming the semiconductor device structure) remove a portion of a gate dielectric layer over inner walls of a trench to improve the yield of work function layers subsequently formed in the trench. Therefore, the yield of transistors with the work function layers is improved.

In accordance with some embodiments, a semiconductor device structure is provided. The semiconductor device structure includes a substrate. The semiconductor device structure includes a gate stack over the substrate. The gate stack includes a first dielectric layer, a work function layer, and a gate electrode sequentially stacked over the substrate, the first dielectric layer has a thin portion and a thick portion, the thin portion is thinner than the thick portion and surrounds the thick portion, and the first dielectric layer is a single-layer structure. The semiconductor device structure includes an insulating layer over the substrate and wrapping around the gate stack. The thin portion is between the thick portion and the insulating layer.

In accordance with some embodiments, a semiconductor device structure is provided. The semiconductor device structure includes a substrate. The semiconductor device structure includes a gate stack over the substrate. The gate stack includes a dielectric layer, a work function layer, and a gate electrode sequentially stacked over the substrate, the work function layer has a bottom surface and a protruding portion protruding from the bottom surface, and the protruding portion has a convex curved sidewall facing the dielectric layer. The semiconductor device structure includes an insulating layer over the substrate and wrapping around the gate stack.

In accordance with some embodiments, a semiconductor device structure is provided. The semiconductor device structure includes a substrate. The semiconductor device structure includes a gate stack over the substrate. The gate stack includes a dielectric layer, a work function layer, and a gate electrode sequentially stacked over the substrate, a first upper portion of the dielectric layer is partially embedded into a bottom portion of the work function layer, and the first upper portion has a concave curved sidewall facing the work function layer. The semiconductor device structure includes an insulating layer over the substrate and wrapping around the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a gate stack over the substrate, wherein the gate stack comprises a first dielectric layer, a work function layer, and a gate electrode sequentially stacked over the substrate, the first dielectric layer has a thin portion and a thick portion, the thin portion is thinner than the thick portion and surrounds the thick portion, and the first dielectric layer is a single-layer structure; and
   an insulating layer over the substrate and wrapping around the gate stack, wherein the thin portion is between the thick portion and the insulating layer.

2. The semiconductor device structure as claimed in claim 1, wherein a thickness of the thin portion decreases toward the insulating layer.

3. The semiconductor device structure as claimed in claim 1, wherein the thick portion and the thin portion are made of a same material.

4. The semiconductor device structure as claimed in claim 1, wherein the thick portion is wider than the thin portion.

5. The semiconductor device structure as claimed in claim 1, wherein the thick portion is between the gate electrode and the substrate.

6. The semiconductor device structure as claimed in claim 1, wherein the work function layer has a bottom surface and a protruding portion protruding from the bottom surface.

7. The semiconductor device structure as claimed in claim 6, wherein the protruding portion is over the thin portion.

8. The semiconductor device structure as claimed in claim 7, wherein the protruding portion is in direct contact with the thin portion.

9. A semiconductor device structure, comprising:
   a substrate;
   a gate stack over the substrate, wherein the gate stack comprises a dielectric layer, a work function layer, and a gate electrode sequentially stacked over the substrate, the work function layer has a bottom surface and a protruding portion protruding from the bottom surface, the protruding portion has a convex curved sidewall facing the dielectric layer, and the dielectric layer under the protruding portion is thinner than a central portion of the dielectric layer; and
   an insulating layer over the substrate and wrapping around the gate stack.

10. The semiconductor device structure as claimed in claim 9, wherein a central portion of the dielectric layer is thicker than the protruding portion.

11. The semiconductor device structure as claimed in claim 10, wherein the central portion of the dielectric layer is wider than the protruding portion.

12. The semiconductor device structure as claimed in claim 9, wherein the protruding portion is embedded into the dielectric layer, and the protruding portion surrounds a central portion of the dielectric layer.

13. The semiconductor device structure as claimed in claim 12, wherein a thickness of the protruding portion increases toward the insulating layer.

14. A semiconductor device structure, comprising:
    a substrate;
    a gate stack over the substrate, wherein the gate stack comprises a dielectric layer, a work function layer, and a gate electrode sequentially stacked over the substrate, a first upper portion of the dielectric layer is partially embedded into a bottom portion of the work function layer, the first upper portion has a concave curved sidewall facing the work function layer, and a first lower portion of the work function layer has an H-like shape; and
    an insulating layer over the substrate and wrapping around the gate stack.

15. The semiconductor device structure as claimed in claim 14, wherein a width of the first upper portion of the dielectric layer continuously increases towards the substrate.

16. The semiconductor device structure as claimed in claim 14, wherein the substrate has a fin structure, and the gate stack wraps around a second upper portion of the fin structure.

17. The semiconductor device structure as claimed in claim 14, wherein a second lower portion of the dielectric layer has a planar sidewall facing the insulating layer.

18. The semiconductor device structure as claimed in claim 14, wherein the work function layer is in direct contact with the concave curved sidewall of the first upper portion of the dielectric layer.

19. The semiconductor device structure as claimed in claim 17, wherein the concave curved sidewall of the first upper portion is connected to the planar sidewall of the second lower portion.

20. The semiconductor device structure as claimed in claim 14, wherein the first lower portion of the work function layer has a convex curved inner wall facing the concave curved sidewall of the first upper portion of the dielectric layer.

* * * * *